United States Patent
Kikuchi et al.

(10) Patent No.: US 7,607,063 B2
(45) Date of Patent: Oct. 20, 2009

(54) DECODING METHOD AND DEVICE FOR DECODING LINEAR CODE

(75) Inventors: Atsushi Kikuchi, Kanagawa (JP); Masayuki Hattori, Kanagawa (JP); Toshiyuki Miyauchi, Tokyo (JP); Kazuo Watanabe, Tokyo (JP); Makiko Kan, Tokyo (JP)

(73) Assignee: Sony Corporation, Tokyo (JP)

( * ) Notice: Subject to any disclaimer, the term of this patent is extended or adjusted under 35 U.S.C. 154(b) by 635 days.

(21) Appl. No.: 10/523,452

(22) PCT Filed: May 28, 2004

(86) PCT No.: PCT/JP2004/007747

§ 371 (c)(1), (2), (4) Date: Jan. 28, 2005

(87) PCT Pub. No.: WO2004/107585

PCT Pub. Date: Dec. 9, 2004

(65) Prior Publication Data

US 2006/0015791 A1    Jan. 19, 2006

(30) Foreign Application Priority Data

May 30, 2003    (JP)    ............................. 2003-153927

(51) Int. Cl.
H03M 13/00    (2006.01)

(52) U.S. Cl. ........................ 714/752; 714/758; 714/800; 714/804

(58) Field of Classification Search ................. 714/752, 714/758, 800, 804
See application file for complete search history.

(56) References Cited

U.S. PATENT DOCUMENTS 3,818,442 A * 6/1974 Solomon .................... 714/781

(Continued)

FOREIGN PATENT DOCUMENTS

JP    2003-115768    4/2003
JP    2004-140828    5/2004

OTHER PUBLICATIONS

Hosoya et al., "Brust Ayamari ni Tekishita Teimitsudo Parity Kensa Fugo no Kosei Hoho", The Institute of Electronics, Information and Communication Engineers Gijutsu Kenkyu Hokoku, IT2003-20, Jul. 22, 2003, pp. 61 to 66.
Lucas R. et al.: "On Iterative Soft-Decision Decoding of Linear Binary Block Codes and Product Codes" IEEE Journal on Selected Areas in Communications, vol. 16, No. 2, Feb. 1998, pp. 279; 281; 283; 284; and 289-290.
Wiberg N. et al., "Codes and Iterative Decoding on General Graphs", European Transactions on Telecommunications and Related Technologies, vol. 6, No. 5, Sep. 1995, pp. 513-525.

(Continued)

*Primary Examiner*—Guy J Lamarre
*Assistant Examiner*—Sam Rizk
(74) *Attorney, Agent, or Firm*—Finnegan, Henderson, Farabow, Garrett & Dunner, L.L.P.

(57) ABSTRACT

The present invention relates to a decoding method and a decoder, a program, a recording-and-reproducing apparatus and a method, and a reproducing apparatus and a method that are suitable for decoding encoded data encoded by using a linear code on ring R. A low-density processing unit performs parity-check-matrix low-density processing, performs linear combination for rows of a parity check matrix included in an obtained reception word, and generates a parity check matrix according to the linear-combination result, thereby reducing the density of the parity check matrix used for decoding, at step S21. Then, at step S22, an LDPC decoding unit performs decoding by using a sum product algorithm (SPA) by using the parity check matrix whose density is reduced through the processing performed at step S21. Where the processing at step S22 is finished, the LDPC decoding unit finishes decoding for the reception word. The present invention can be used for an error-correction system.

13 Claims, 31 Drawing Sheets

U.S. PATENT DOCUMENTS

| | | | |
|---|---|---|---|
| 6,789,227 B2* | 9/2004 | De Souza et al. | 714/804 |
| 2003/0074626 A1* | 4/2003 | Coker et al. | 714/752 |
| 2004/0064776 A1 | 4/2004 | Yedidia et al. | |
| 2004/0185886 A1* | 9/2004 | Matsumoto | 455/502 |
| 2004/0199859 A1* | 10/2004 | Matsumoto | 714/801 |

OTHER PUBLICATIONS

Frank R. Kschischang et al., "Factor Graphs and the Sum-Product Algorithm", IEEE Transactions on Information Theory, vol. 47, No. 2, Feb. 2001, pp. 498-519, pp. 508-510.

Lucas et al., "Iterative Decoding of One-Step Majority Logic Decodable Codes Based on Belief Propagation", IEEE Transactions on Communications, vol. 48, No. 6, Jun. 2000, pp. 931-937.

Gallager, "Low-Density Parity-Check Codes", IRE Transactions on Information Theory, Jan. 1962, pp. 21-28.

Hagenauer J. et al., "Improving the standard Coding System for Deep Space Missions", Pro. IEEE International Conference on Communications, vol. 3, May 23 1993-May 26, 1993, pp. 1092-1097.

Ait Sab O, "FEC Contribution in Submarine Transmission Systems", Proc., The Suboptic. International Convention on Undersea Communications, May 2001, pp. 496-499.

Mackay, "Good Error-Correcting Codes Based on Very Sparse Matrices", IEEE Transactions on Information Theory, vol. 45, No. 2, pp. 399-431, Mar. 1999.

Luby et al., "Analysis of Low Density Codes and Improved Designs Using Irregular Graphs", Proceedings of ACM Symposium on Theory of Computing, pp. 249-258, 1998.

Wadayama, "Low Density Parity Check Code and Sum-Product Algorithm", [online], Jun. 22, 2001, Okayama Prefectural University, [searched on May 19, 2003], the Internet URL:http://vega.c.okapu.ac.jp/~wadayama/pdf/LDPC.pdf.

* cited by examiner

FIG. 1

$$H_{LDPC} = \begin{pmatrix} 1 & 0 & 0 & 1 & 1 & 1 & 0 & 0 \\ 0 & 1 & 1 & 0 & 1 & 0 & 1 & 0 \\ 1 & 0 & 1 & 0 & 0 & 1 & 0 & 1 \\ 0 & 1 & 0 & 1 & 0 & 0 & 1 & 1 \end{pmatrix}$$

(PRIOR ART)

(PRIOR ART)

(PRIOR ART)

FIG. 5

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

(PRIOR ART)

(PRIOR ART)

(PRIOR ART)

FIG. 9

$$H = \begin{pmatrix} 1 & 1 & 1 & \cdots & 1 \\ 1 & \alpha & \alpha^2 & \cdots & \alpha^{n-1} \\ 1 & \alpha^2 & \alpha^2 & \cdots & \alpha^{2(n-1)} \\ \vdots & \vdots & \vdots & & \vdots \\ 1 & \alpha^{2-1} & \alpha^{2(2t-1)} & \cdots & \alpha^{(2t-1)(n-1)} \end{pmatrix}$$

(PRIOR ART)

FIG. 15

$$H = \begin{pmatrix} 1000100110010111 \\ 0100110101111100 \\ 0010011010111110 \\ 0001001101011111 \\ 1000110001100001 \\ 0001100011000011 \\ 0010100101000101 \\ 0111101111101111 \end{pmatrix}$$

FIG. 17

$$H_{SP4} = \begin{pmatrix} 1000100000000110 \\ 0100010000000011 \\ 1010001000000001 \\ 1101000100000000 \\ 0110100010000000 \\ 0011010001000000 \\ 0001101000100000 \\ 0000110100010000 \\ 0000011010001000 \\ 0000001101000100 \\ 0000000110100010 \\ 0000000011010001 \\ 1000000001101000 \\ 0100000000110100 \\ 0010000000011010 \\ 0001000000001101 \end{pmatrix}$$

FIG. 22

$$H = \begin{pmatrix} 1 & 1 & 1 & 1 & 1 & 1 & 1 & 1 & 1 & 1 & 1 & 1 & 1 & 1 \\ 1 & \alpha & \alpha^2 & \alpha^3 & \alpha^4 & \alpha^5 & \alpha^6 & \alpha^7 & \alpha^8 & \alpha^9 & \alpha^{10} & \alpha^{11} & \alpha^{12} & \alpha^{13} & \alpha^{14} \\ 1 & \alpha^2 & \alpha^4 & \alpha^6 & \alpha^8 & \alpha^{10} & \alpha^{12} & \alpha^{14} & \alpha^{16} & \alpha^{18} & \alpha^{20} & \alpha^{22} & \alpha^{24} & \alpha^{26} & \alpha^{28} \\ 1 & \alpha^3 & \alpha^6 & \alpha^9 & \alpha^{12} & \alpha^{15} & \alpha^{18} & \alpha^{21} & \alpha^{24} & \alpha^{27} & \alpha^{30} & \alpha^{33} & \alpha^{36} & \alpha^{39} & \alpha^{42} \end{pmatrix}$$

FIG. 23

| H = | | | | | | | | | | | | | | | |
|---|---|---|---|---|---|---|---|---|---|---|---|---|---|---|---|
| 1000 | 1000 | 1000 | 1000 | 1000 | 1000 | 1000 | 1000 | 1000 | 1000 | 1000 | 1000 | 1000 | 1000 | 1000 | 1000 |
| 0100 | 0100 | 0100 | 0100 | 0100 | 0100 | 0100 | 0100 | 0100 | 0100 | 0100 | 0100 | 0100 | 0100 | 0100 | 0100 |
| 0010 | 0010 | 0010 | 0010 | 0010 | 0010 | 0010 | 0010 | 0010 | 0010 | 0010 | 0010 | 0010 | 0010 | 0010 | 0010 |
| 0001 | 0001 | 0001 | 0001 | 0001 | 0001 | 0001 | 0001 | 0001 | 0001 | 0001 | 0001 | 0001 | 0001 | 0001 | 0001 |
| 1000 | 0100 | 0010 | 0001 | 0010 | 1001 | 1100 | 0100 | 0010 | 1001 | 1100 | 0100 | 1000 | 0010 | 0001 | 0001 |
| 0100 | 0010 | 1001 | 1000 | 1001 | 1100 | 0100 | 0010 | 1100 | 0110 | 1011 | 1001 | 0100 | 1001 | 1100 | 1000 |
| 0010 | 1001 | 1100 | 0100 | 1100 | 0110 | 1011 | 1001 | 0110 | 0011 | 1101 | 1100 | 0010 | 1100 | 0110 | 0100 |
| 0001 | 1000 | 0100 | 0010 | 0100 | 1000 | 0001 | 0100 | 1000 | 1001 | 0100 | 0010 | 0001 | 0100 | 1000 | 0010 |
| 1000 | 0010 | 1100 | 0110 | 1011 | 1010 | 1101 | 1110 | 0111 | 1010 | 1001 | 1011 | 0111 | 1110 | 1101 | 1010 |
| 0110 | 1011 | 0110 | 1011 | 0101 | 1101 | 1110 | 1111 | 0011 | 1101 | 1100 | 0101 | 0011 | 1111 | 0111 | 0111 |
| 1011 | 1010 | 1011 | 1010 | 1010 | 1110 | 1111 | 0111 | 1001 | 1110 | 0110 | 0010 | 0001 | 1010 | 1011 | 1110 |
| 1001 | 0101 | 1001 | 0101 | 0110 | 1011 | 1101 | 1101 | 1100 | 1111 | 0011 | 1001 | 1000 | 0101 | 1101 | 1101 |
| 0111 | 0011 | 0111 | 0111 | 1110 | 1001 | 0111 | 1001 | 1000 | 0001 | 0111 | 1011 | 0111 | 1001 | 1000 | 0001 |
| 0011 | 1001 | 0011 | 0011 | 1111 | 1100 | 1011 | 1100 | 0100 | 1000 | 0011 | 1101 | 1011 | 1100 | 0100 | 1000 |
| 0001 | 0001 | 0001 | 0001 | 0111 | 0110 | 0101 | 0110 | 0010 | 0100 | 1001 | 1110 | 1101 | 0110 | 0010 | 0100 |
| 1111 | 1111 | 1111 | 1111 | 1101 | 0011 | 1010 | 0011 | 0001 | 0010 | 1100 | 0111 | 1110 | 0011 | 0001 | 0010 |
| 1001 | 1001 | 1001 | 1001 | 1000 | 0100 | 0010 | 0001 | 0111 | 1011 | 1101 | 1110 | 0111 | 0001 | 1000 | 0111 |
| 1100 | 1100 | 1100 | 1100 | 0100 | 0010 | 0001 | 1000 | 0011 | 0101 | 1110 | 1111 | 0011 | 1000 | 0100 | 1011 |
| 0110 | 0110 | 0110 | 0110 | 0010 | 0001 | 1000 | 0100 | 0001 | 0010 | 0111 | 1011 | 0001 | 0100 | 0010 | 0101 |
| 0011 | 0011 | 0011 | 0011 | 0001 | 1000 | 0100 | 0010 | 1000 | 1001 | 0011 | 1101 | 1000 | 0010 | 0001 | 1010 |
| 0111 | 0011 | 0001 | 1000 | 1110 | 1111 | 0111 | 1011 | 1011 | 1101 | 1110 | 1001 | 0111 | 1101 | 1110 | 1011 |
| 1110 | 0001 | 1000 | 0100 | 1111 | 0111 | 1011 | 1101 | 0101 | 1110 | 1111 | 1100 | 0011 | 1110 | 1111 | 0101 |
| 1011 | 1000 | 0100 | 0010 | 0111 | 1011 | 1101 | 1110 | 1010 | 0111 | 1111 | 0110 | 1001 | 1111 | 1010 | 1010 |
| 1101 | 0100 | 0010 | 0001 | 1011 | 1101 | 1110 | 0111 | 1101 | 1011 | 0111 | 0011 | 1100 | 1111 | 0101 | 0101 |
| 0111 | 1110 | 1101 | 1011 | 0001 | 1000 | 0100 | 0010 | 0111 | 0011 | 0001 | 1000 | 0111 | 1011 | 1101 | 0111 |
| 0001 | 1101 | 1110 | 0111 | 1000 | 0100 | 0010 | 0001 | 1011 | 0001 | 1000 | 0100 | 1011 | 1101 | 1110 | 1011 |
| 1000 | 1011 | 0111 | 1110 | 0100 | 0010 | 0001 | 1000 | 1101 | 1000 | 0100 | 0010 | 1101 | 1110 | 0111 | 1101 |
| 0100 | 0111 | 1110 | 1101 | 0010 | 0001 | 1000 | 0100 | 1110 | 0100 | 0010 | 0001 | 1110 | 0111 | 1011 | 1110 |
| 0001 | 0011 | 0111 | 1111 | 0011 | 1001 | 1100 | 0110 | 0011 | 0001 | 1000 | 0100 | 0111 | 0011 | 0001 | 1111 |
| 1000 | 1001 | 1011 | 1111 | 1001 | 1100 | 0110 | 0011 | 1001 | 1000 | 0100 | 0010 | 1011 | 1001 | 1000 | 1111 |
| 0100 | 1100 | 1101 | 1111 | 1100 | 0110 | 0011 | 1001 | 1100 | 0100 | 0010 | 0001 | 1101 | 1100 | 0100 | 0111 |
| 0010 | 0110 | 1110 | 1111 | 0110 | 0011 | 1001 | 1100 | 0110 | 0010 | 0001 | 1000 | 1110 | 0110 | 0010 | 1011 |

DECODING METHOD AND DEVICE FOR DECODING LINEAR CODE

TECHNICAL FIELD

The present invention relates to a decoding method and a decoder, a program, a recording-and-reproducing apparatus and a method, and a reproducing apparatus and a method, and particularly relates to a decoding method and a decoder, a program, a recording-and-reproducing apparatus and a method, and a reproducing apparatus and a method that are suitable for decoding encoded data encoded by using a linear code on ring R.

BACKGROUND ART

In recent years, as the field of communications such as mobile communications and deep-space communications, and the field of broadcast such as ground-wave broadcast and satellite digital broadcast are studied with remarkable progress, for example, the coding theory is actively studied to increase the efficiency of error-correction encoding and decoding.

Shannon limit presented by so-called Shannon (C. E. Shannon) communication-path encoding theorem is known, as the theoretical limits of code performance. The coding theory is studied for developing a code that presents performance approaching the above-described Shannon limit. In recent years, a method referred to as so-called turbo coding including parallel concatenated convolutional codes (PCCC), serially concatenated convolutional codes (SCCC), and so forth, was developed, as an encoding method that presents performance approaching Shannon limit. Further, aside from the turbo codes being developed, a known encoding method, that is, low-density parity check codes (hereinafter referred to as LDPC codes) are receiving attention.

The LDPC code was suggested first time in "R. G. Gallager, "Low Density Parity Check Codes", Cambridge, Mass.: M.I.T.Press, 1963" by R. G. Gallager. Then, the LDPC code receives further attention by "D. J. C. MacKay, "Good error correcting codes based on very sparse matrices", Submitted to IEEE Trans. Inf. Theory, IT-45, pp. 399-431, 1999, "M. G. Luby M. Mitzenmacher, M. A. Shokrollahi and D. A. Spielman, "Analysis of low density codes and improved designs using irregular graphs", in Proceedings of ACM Symposium on Theory of Computing, pp. 249-258, 1998", and so forth.

According to studies in recent years, the performance of the LDPC code approaches Shannon limit with increases in the code length. Further, since the minimum distance of the LDPC code is proportional to the code length, the LDPC code has the following advantages, as its features. That is to say, the LDPC code has high block-error probability qualities and hardly causes a so-called error-floor phenomenon that is observed in qualities of decoding turbo codes or the like.

The above-described LDPC code will be described in detail, as below. The LDPC code is a linear code and not necessarily binary. However, in this specification, it will be described on the assumption that the LDPC code is binary.

The major characteristic of the LDPC code is that a parity check matrix defining the LDPC code is sparse. Here, the sparse matrix denotes a matrix including very few components whose values are "1". The sparse check matrix is designated by reference character H. The sparse check matrix includes $H_{LDPC}$ shown in FIG. 1, where Hamming weight (the number of "1") of each row is "2" and that of each column is "4", for example.

Thus, the LDPC code defined by a check matrix H, where Hamming weight of each of the rows and columns is constant, is referred to as a regular LDPC code. On the other hand, an LDPC code defined by a check matrix H, where Hamming weight of each of the rows and columns is not constant, is referred to as an irregular LDPC code.

Encoding by using the above-described LDPC code is achieved by a generating generation matrix G based on the check matrix H and generating a code word by multiplying the generation matrix G by binary-data message. More specifically, first, an encoder for performing encoding by the LDPC code calculates the generation matrix G, where an equation $GH^T=0$ holds, between the check matrix H and a transposed matrix $H^T$. Where the generation matrix G is a k×n matrix, the encoder multiplies the generation matrix G by a k-bit data message (vector u) and generates an n-bit code word c (=uG). In the code word generated by the encoder, a code bit whose value is "0" is mapped to "+1" and a code bit whose value is "1" is mapped to "1". Then, the code word is transmitted and received on the reception side via a predetermined communication path.

Decoding of the LDPC code can be performed by using an algorithm named and proposed by Gallager, as probabilistic decoding, that is, a message passing algorithm by belief propagation on a so-called Tanner graph including a variable node (sometimes referred to as a message node) and a check node. Hereinafter, the variable node and the check node are simply referred to as nodes, as required.

For example, the parity check matrix $H_{LDPC}$ shown in FIG. 1 is expressed by a Tanner graph shown in FIG. 2. In the Tanner graph shown in FIG. 2, each column of the parity check matrix $H_{LDPC}$ shown in FIG. 1 is determined to be a variable node and each row is determined to be a check node. Further, the j-th variable node and the i-th check node are connected to an element whose value is "1" on the i-th row and the j-th column of the parity check matrix $H_{LDPC}$, as edges.

However, where the probability decoding is performed, the value of a message transmitted between the nodes is given, as a real number. Subsequently, there is a need to track the probability distribution of messages having consecutive values for analytical solution, which is extremely difficult. Therefore, Gallager proposed algorithms A and B, as an algorithm for decoding the LDPC code.

Usually, the LDPC-code decoding is achieved by performing procedures shown in FIG. 2. Here, in this case, a reception value (a received code sequence) is determined to be $U_0(u_{0i})$, a message transmitted from the check node is determined to be $u_j$, and a message transmitted from the variable node is determined to be vi. Further, in this case, the message is a real-number value indicating the probability that the value is "0", as a so-called log likelihood ratio.

Usually, decoding the LDPC code is achieved by performing procedures shown in FIG. 3. Here, in this case, the reception value (the received code sequence) is determined to be $U_0(u_{0i})$, the message transmitted from the check node is determined to be $u_j$, and the message transmitted from the variable node is determined to be $v_i$. Further, in this case, the message is the real-number value indicating the probability that the value is "0", as the so-called log likelihood ratio.

First, for decoding the LDPC code, a reception value $U_0(u_{0i})$ is received, a message $u_j$ is initialized to "0", and a variable k that is an integer functioning as a counter of repetition processing is initialized to "0", at step S1, and the processing advances to step S2, as shown in FIG. 3. At step S2, the message $v_i$ is obtained by performing calculation shown by Equation (1) (variable-node calculation) based on the reception value $U_0(u_{0i})$, and the message $u_j$ is obtained by performing calculation shown in Equation (2) (check-node calculation) based on the message $v_i$.

$$v_i = u_{0i} + \sum_{j=1}^{d_v-1} u_j \quad \text{Equation (1)}$$

$$\tanh\left(\frac{u_j}{2}\right) = \prod_{i=1}^{d_c-1} \tanh\left(\frac{v_i}{2}\right) \quad \text{Equation (2)}$$

Here, $d_v$ and $d_c$ shown in Equations (1) and (2) are parameters that indicate the number of "1" along the vertical direction (columns) and the horizontal direction (rows) of the check matrix H and that can be arbitrarily selected, respectively. For example, in the case of a code (3, 6), equations $d_v=3$ and $d_c=6$ hold.

Further, in the calculations shown by Equations (1) and (2), a message input from an edge for outputting messages (a line connecting the variable node to the check node) is not used, as a parameter of sum operation or product operation. Therefore, the area of sum or product operation is determined to be 1 to $d_v-1$, or 1 to $d_c-1$. Further, the calculation shown in Equation (2) is actually performed by generating a table of a function $R(v_1, v_2)$ shown in Equation (3) defined by one output for two inputs v1 and v2 in advance, and using the table consecutively (recursively), as shown in Equation (4).

$$x = 2\tan h^{-1}\{\tan h(v_1/2)\tan h(v_2/2)\} = R(v_1, v_2) \quad \text{Equation (3)}$$

$$u_j = R(v_1, R(v_2, R(v_3, \ldots, R(v_{d_c-2}, v_{d_c-1})))) \quad \text{Equation (4)}$$

At step S2, further, the variable k is incremented by "1", and the processing advances to step S3. At step S3, it is determined whether or not the variable k is larger than a predetermined repetition-decoding number N. Where it is determined that the variable k is not larger than N, at step S3, the processing returns to step S2, and the same processing is repeated thereafter.

Further, where it is determined that the variable k is larger than N, at step S3, the processing advances to step S4, so that the calculation shown in Equation (5) is performed, whereby the message $v_i$ is obtained and output, as a decoding result that is finally output. Then, the LDPC-code decoding is finished.

$$v_i = u_{0i} + \sum_{j=1}^{d_v} u_j \quad \text{Equation (5)}$$

Here, different from the calculation shown in Equation (1), the calculation shown in Equation (5) is performed by using messages input from all the edges connected to the variable node.

Where the LDPC-code decoding is performed by using the code (3, 6), for example, messages are transmitted between the nodes, as shown in FIG. 4. Further, the calculation shown in Equation (1) is performed at nodes indicated by signs "=" (variable nodes) shown in FIG. 4 and the calculation shown in Equation (2) is performed at nodes indicated by signs "+" (check nodes). Particularly, in the case of an algorithm A, the messages are divided into two and an exclusive OR operation is performed for $d_c-1$ input messages at the nodes indicated by the signs "+". Where all the bit values of $d_v-1$ input messages are different from one another for a reception value R at the nodes indicated by the signs "=", the code is reversed and output.

Aside from the above-described technology, in recent years, methods for mounting the LDPC-code decoding are studied. First, the LDPC-code decoding will be schematically described before describing the mouthing method.

FIG. 5 is an example parity check matrix of the LDPC code (3, 6) (where the encoding ratio is ½ and the code length is 12). The parity check matrix of the LDPC code can be written through a Tanner graph, as shown in FIG. 6. Here, in FIG. 6, check nodes are indicated by signs "+" and variable nodes are indicated by signs "=". The check nodes and the variable nodes correspond to the rows and columns of the parity check matrix, respectively. Connections between the check nodes and the variable nodes are edges and correspond to "1" of the parity check matrix. That is to say, where a component in the j-th row and the i-th column of the parity check matrix is one, the i-th variable node (a node indicated by the sign "=") from top and the j-th check node (a node indicated by the sign "+") from top are connected to each other by the edge, as shown in FIG. 6. The edge indicates that a code bit corresponding to the variable node has a constraint condition corresponding to the check node. Further, FIG. 6 shows the Tanner graph of the parity check matrix shown in FIG. 5.

A sum product algorithm can be used, as the LDPC-code decoding method (Refer to "Tadashi Wadayama, "Low density parity check code and sum-product algorithm", Jun. 22, 2001, Okayama Prefectural University", for example).

According to the sum product algorithm, the variable-node operation and the check-node operation are performed repetitively.

At the variable node, the operation shown in Equation (1) (the variable-node operation) is performed, as shown in FIG. 7. That is to say, according to FIG. 7, the message $v_i$ corresponding to an edge for which a calculation is to be performed is calculated by using messages $u_1$ and $u_2$ transmitted from the other edges connected to the variable node and the reception data $u_{0i}$. Messages corresponding to the other edges are calculated in the same manner.

Next, Equation (2) is rewritten by using the relation expressed by the equation $a \times b = \exp\{\ln(|a|) + \ln(|b|)\} \times \text{sign}(a) \times \text{sign}(b)$, as shown by Equation (6), before describing the check-node operation. Here, where the expression $x \geq 0$ holds, the sign(x) is one, and where the expression $x<0$ holds, the sign(x) is negative one.

$$u_j = 2\tanh^{-1}\left(\prod_{i=1}^{d_c-1} \tanh\left(\frac{v_i}{2}\right)\right) \quad \text{Equation (6)}$$

$$= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right]$$

$$= 2\tanh^{-1}\left[\exp\left\{-\left(\sum_{i=1}^{d_c-1} -\ln\left(\tanh\left(\frac{|v_i|}{2}\right)\right)\right)\right\}\right] \times \prod_{i=1}^{d_c-1} \text{sign}(v_i)$$

Further, where the expression $x \geq 0$ holds and $\phi(x)$ is defined as $\ln(\tan h(x/2))$, the expression $\phi^{-1}(x)=2\tan h^{-1}(e^{-x})$ holds. Therefore, Equations (6) can be written, as shown by Equation (7).

$$u_j = \phi^{-1}\left(\sum_{i=1}^{d_c-1} \phi(|v_i|)\right) \times \prod_{i=1}^{d_c-1} \text{sign}(v_i) \qquad \text{Equation (7)}$$

The operation shown in Equation (7) (check-node operation) is performed, at the check node, as shown in FIG. 8. That is to say, in FIG. 8, the message $u_j$ corresponding to an edge for which a calculation is to be performed is calculated by using messages $v_1$, $v_2$, $v_3$, $v_4$, and $v_5$ transmitted from the other edges connected to the check node. Messages corresponding to the other edges are calculated in the same manner.

Further, the function $\phi(x)$ can be expressed, as the equation $\phi(x)=\ln((e^x+1)/(e^x-1))$. Further, the function $\phi(x)$ can be expressed, as the equation $\phi(x)=\phi^{-1}(x)$, where the expression x>0 holds. The functions $\phi(x)$ and $\phi^{-1}(x)$ are often mounted on hardware by using an LUT (look up table). The same LUT can be used for both the functions.

Where the sum product algorithm is mounted on hardware, the variable-node operation shown in Equation (1) and the check-node operation shown in Equation (7) need to be performed repetitively by using a circuit with suitable size and at suitable operation frequencies.

Further, methods for calculating the cost of LDPC-code operation using the above-described sum product algorithm are widely known (Refer to "Matthew C. Davey, David J C MacKay "Low Density Parity Check Codes over GF(q)"", for example.).

For obtaining high decoding qualities by using the sum product algorithm (SPA) as described above, the density of the parity check matrix must be low.

Further, FIG. 9 shows a parity check matrix H of the other ordinary linear code, such as a Reed-Solomon code, where the primitive root of a definition field is determined to be a. Usually, the density of the parity check matrix H of a linear code is not low, as shown in FIG. 9. For the Reed-Solomon code whose density is not low, decoding using Euclid's algorithm or the like (hereinafter referred togas ordinary decoding) is performed.

FIG. 10 is a block diagram illustrating the configuration of an example error-correction system for performing error correction by using the Reed-Solomon code. The error-correction system shown in FIG. 10 is a system used for a digital-communication system such as a digital TV, for example.

In the error-correction system shown in FIG. 10, digital data transmitted from an encoder 10 on the transmission side is transmitted to a decoder 30 on the reception side via a communication path 21 such as the Internet, for example.

The encoder 10 includes a Reed-Solomon encoding unit 11 for encoding externally transmitted digital data for transmission by using the Reed-Solomon code, an interleaver 12 for rearranging the encoded digital data, a convolutional-encoding unit 13 for performing convolutional encoding, and a communication processing unit 14 for communicating with the decoder 30 via the communication path 21.

Further, the decoder 30 includes a communication processing unit 31 for obtaining a transmission word transmitted via the communication path 21, a convolutional-decoding unit 32 for performing convolutional decoding for the obtained transmission word, a deinterleaver 33 for resetting the rearranged data to the original order, and a Reed-Solomon decoding unit 34 for performing Reed-Solomon decoding (ordinary decoding).

The transmission digital data transmitted from outside the encoder 10 is encoded into a Reed-Solomon code through the Reed-Solomon encoding unit 11 of the encoder 10 and transmitted to the interleaver 12. The interleaver 12 performs data rearranging (interleaving) for diffusing burst errors that occur mainly in the communication path 21. Since the Reed-Solomon code performs error correction, where a plurality of bits is regarded as a single symbol, the interleaver 12 performs symbol interleaving for diffusing the burst errors per symbol.

The rearranged transmission digital data is further subjected to convolutional encoding through the convolutional-encoding unit 13 based on a plurality of data blocks so that code sequences are determined in sequence. For example, upon receiving the digital data for each k-bit data block from the interleaver 12, the convolutional-encoding unit 13 with a constraint length K encodes the digital data to an n-bit code block based on not only the data block transmitted at that time but also K data blocks including data blocks that had been provided.

Then, the convolutional-encoded digital data is converted to data that can be transmitted through the communication processing unit 14 and transmitted to the decoder 30 via the communication path 21.

The decoder 30 obtains the transmission word transmitted via the communication path 21 wired or unwired in the communication processing unit 31. The obtained transmission word is subjected to convolutional decoding through the convolutional-decoding unit 32. Upon receiving the convolutional-decoded data, the deinterleaver 33 performs processing for resetting the rearranged data to the original order (deinterleaving) through rearranging the data according to a method corresponding to the interleaving performed by the interleaver 12 of the encoder. The Reed-Solomon decoding unit 34 performs Reed-Solomon decoding by ordinary decoding for the digital data reset to the original order, reconstitutes the digital data in the previous state where Reed-Solomon encoding is not yet performed, and transmits the data to outside the decoder 30.

In the above-described manner, the error correction system shown in FIG. 10 corrects errors occur during communications and performs communications more precisely than ever.

FIG. 11 is a block diagram illustrating the configuration of an example recording-and-reproducing apparatus using the error correction system for performing the error correction by using the Reed-Solomon code. The recording-and-reproducing apparatus shown in FIG. 11 is a digital-recording-medium recording-and-reproducing apparatus such as a DVD (Digital Versatile Disc) record player, for example.

The recording-and-reproducing apparatus 50 shown in FIG. 11 encodes the externally transmitted digital data through the encode-processing unit 60 and records the digital data onto a recording medium 72 in a recording-and-reproducing unit 70. Further, the recording-and-reproducing apparatus 50 reproduces the digital data recorded on the recording medium 72 in the recording-and-reproducing unit 70, obtains the original digital data through performing decoding in a decoding unit 80, and externally outputs the data.

The encode-processing unit 60 includes first to n-th Reed-Solomon encoding units 61-1 to 61-n for performing Reed-Solomon encoding for the digital data, where the Reed-Solomon encoding relates to degrees that are different from one another.

The recording-and-reproducing unit 70 includes a recording unit 71 for recording the data transmitted from the encode-processing unit 60 onto the recording medium 72, the recording medium 72 such as an optical disk, for example, and a reproducing unit 73 for reproducing the data recorded on the recording medium 72.

Further, the decode-processing unit 80 is a decoder corresponding to the encode-processing unit 60 and includes first to n-th Reed-Solomon decoding units 81-1 to 81-n for performing Reed-Solomon decoding (ordinary decoding) relating to degrees that are different to one another for the digital data.

The digital data transmitted from outside the encode-processing unit 60 is subjected to Reed-Solomon encoding relating to degree one in the first Reed-Solomon encoding unit 61-1. Then, the digital data is sequentially subjected to Reed-Solomon encoding relating to each of degrees two to n in the second to n-th Reed-Solomon encoding units 61-2 to 61-n. Where the n-th Reed-Solomon encoding unit 61-n finishes encoding, the encode-processing unit 60 transmits the encoded digital data to the recording-and-reproducing unit 70. The recording unit 71 of the recording-and-reproducing unit 70 records the digital data transmitted from the encode-processing unit 60 onto the recording medium 72.

The reproducing unit 73 of the recording-and-reproducing unit 70 reproduces the digital data recorded on the recording medium 72 (the encoded digital data) and transmits the digital data to the decode-processing unit 80.

The decode-processing unit 80 performs Reed-Solomon decoding (ordinary decoding) relating to each degree for the digital data transmitted from the reproducing unit 73 in the first to n-th Reed-Solomon decoding units 81-1 to 81-n and reconstitutes the original digital data. Further, the decode-processing unit 80 performs decoding that is the reverse of decoding performed by the encode-processing unit 60. First, the decode-processing unit 80 performs decoding relating to degree n in the n-th Reed-Solomon decoding unit 81-n, and subsequently performs the Reed-Solomon decoding in decreasing order of degrees, that is, from degree n-1 to degree n-2. Finally, the decode-processing unit 80 performs decoding relating to the first degree. The decode-processing unit 80 outputs the reconstituted original digital data to outside the recording-and-reproducing apparatus 50.

As has been described, the recording-and-reproducing apparatus 50 shown in FIG. 11 corrects data errors that occur during data recording or reproducing.

The ordinary decoding for the above-described Reed-Solomon code, a BCH (Bose-Chaudhuri-Hocquenghem) code, and so forth, is a decoding method used for a hard-decision reception word where a reception value is estimated to be only "0" or "1".

However, where a soft-decision reception word is obtained and where a Reed-Solomon code is subjected to the ordinary decoding in a system that can obtain the soft-decision reception word, the decoding quality is low. This is because the decoding quality obtained by using the hard-decision reception word is usually lower than in the case where the soft-decision reception word is used.

Subsequently, the above-described method for decoding by using the sum product algorithm is considered. However, since the density of a parity check matrix of a widely-used linear code is not low in most cases, the decoding quality does not increase. Further, if the density of a provided parity check matrix was low, the configuration of a sum product algorithm on a large finite field would be much complicated, which would increase the operation cost.

DISCLOSURE OF INVENTION

Accordingly, the present invention is achieved for easily performing high-performance decoding in the case where a sum product algorithm is used, as a method for decoding an ordinary linear code.

A first decoding method of the present invention is characterized by including a low-density processing step for reducing the density of elements whose values are determined to be one, for a check matrix of the linear code, and a decoding step for decoding the linear code through a sum product algorithm by using the check matrix whose density is reduced through the low-density processing step.

The ring may be a finite field including powers of prime numbers, as elements.

The linear code may include a BCH code, or a Reed-Solomon code on the finite field.

The low-density processing step may include a linear-combination calculation step for calculating linear combination of rows of the check matrix, and a check-matrix generation step for extracting a subset of lower-weight vectors for forming a complementary space from among a vector set obtained by the linear combination calculated through the linear-combination calculation step and generating a new check matrix including all the vectors of the vector subset, as row elements.

The low-density processing step may further include an expansion step for expanding the check matrix on the finite field on a predetermined subfield of the finite field in a predetermined degree. The linear-combination calculation step may be provided for calculating linear combination of the rows of the check matrix expanded through the expansion step.

A first decoder of the present invention is characterized by including low-density processing means that performs low-density processing for reducing the density of elements whose values are determined to be one, for a check matrix of the linear code, and decoding means for decoding the linear code through a sum product algorithm by using the check matrix whose density is reduced by the low-density processing means.

The ring may be a finite field including powers of prime numbers, as elements.

The linear code may include a BCH code, or a Reed-Solomon code on the finite field.

The low-density processing means may include linear-combination calculation means for calculating linear combination of rows of the check matrix and check-matrix generation means for extracting a subset of lower-weight vectors for forming a complementary space from among a vector set obtained by the linear combination calculated by the linear-combination calculation means and generating a new check matrix including all the vectors of the vector subset, as row elements.

The low-density processing means may further include expansion means for expanding the check matrix on the finite field on a predetermined subfield of the finite field in a predetermined degree. The linear-combination calculation means may calculate linear combination of rows of the check matrix expanded by the expansion means.

The decoder may further include soft-decision decoding means for performing soft-decision decoding for a linear code subjected to convolutional encoding. The low-density processing means reduces the density of the elements whose values are determined to be one, for the check matrix of the linear code subjected to the soft-decision decoding by the soft-decision decoding means.

The soft-decision decoding by the soft-decision decoding means, the low-density processing by the low-density processing means, and the decoding by the decoding means may be repetitively performed.

A first program of the present invention is characterized in that a computer is made to perform a low-density processing step for reducing the density of elements whose values are determined to be one, for a check matrix of a linear code on ring R, and a decoding step for decoding the linear code through a sum product algorithm by using the check matrix whose density is reduced through the low-density processing step.

A second decoding method of the present invention is characterized by including an input step for inputting a reception value and a decoding step for decoding a linear code through a sum product algorithm, for a check matrix of the linear code, by using the check matrix, where the density of elements whose values are determined to be one is reduced, and the reception value input through the input step.

A second decoder of the present invention is characterized by including input means for inputting a reception value, and decoding means for decoding a linear code through a sum product algorithm, for a check matrix of the linear code, by using the check matrix, where the density of elements whose values are determined to be one is reduced, and the reception value input by the input means.

A second program of the present invention is characterized in that a computer is made to perform an input step for inputting a reception value and a decoding step for decoding a linear code through a sum product algorithm, for a check matrix of the linear code, by using the check matrix, where the density of elements whose values are determined to be one is reduced, and the reception value input through the input step.

A first recording-and-reproducing apparatus of the present invention is characterized by including recording means for recording a linear code on ring R onto a recording medium, reproducing means for reproducing the linear code recorded by the recording means, low-density processing means that performs low-density processing for reducing the density of elements whose values are determined to be one, for a check matrix of the linear code reproduced by the reproducing means, and decoding means for decoding the linear code through a sum product algorithm by using the check matrix whose density is reduced by the low-density processing means.

The linear code may be a linear code subjected to product coding in a predetermined degree, the low-density processing means may perform the low-density processing for the check matrix for each degree, and the decoding means may perform decoding through the sum product algorithm for each degree of the low-density check matrix.

The low-density processing by the low-density processing means and the decoding by the decoding means may be repetitively performed.

A first recording-and-reproducing method of the present invention is characterized by including a recording-control step for having control over recording a linear code on ring R onto a recording medium, a reproducing-control step for having control over reproducing the linear code recorded under the control of the recording-control step, a low-density processing step for performing low-density processing for reducing the density of elements whose values are determined to be one, for a check matrix of the linear code reproduced under the control of the reproducing-control step, and a decoding step for decoding the linear code through a sum product algorithm by using the check matrix whose density is reduced through the low-density processing step.

A third program of the present invention is characterized in that a computer is made to perform a recording-control step for having control over recording a linear code on ring R onto the recording medium, a reproducing-control step for having control over reproducing the linear code recorded under the control of the recording-control step, a low-density processing step for performing low-density processing for reducing the density of elements whose values are determined to be one, for a check matrix of the linear code reproduced under the control of the reproducing-control step, and a decoding step for decoding the linear code through a sum product algorithm by using the check matrix whose density is reduced through the low-density processing step.

A second recording-and-reproducing apparatus of the present invention is characterized by including recording means for recording a linear code on ring R onto the recording medium, reproducing means for reproducing the linear code recorded by the recording means, decoding means for decoding the linear code through a sum product algorithm, for a check matrix of the linear code, by using the check matrix, where the density of elements whose values are determined to be one is reduced.

A second recording-and-reproducing method of the present invention is characterized by including a recording-control step for having control over recording a linear code on ring R onto a recording medium, a reproducing-control step for having control over reproducing the linear code recorded under the control of the recording-control step, a decoding step for decoding the linear code through a sum product algorithm, for a check matrix of the linear code, by using the check matrix, where the density of elements whose values are determined to be one is reduced.

A fourth program of the present invention is characterized in that a computer is made to perform a recording-control step for having control over recording a linear code on ring R onto the recording medium, a reproducing-control step for having control over reproducing the linear code recorded under the control of the recording-control step, and a decoding step for decoding the linear code through a sum product algorithm, for a check matrix of the linear code, by using the check matrix, where the density of elements whose values are determined to be one is reduced.

A first reproducing apparatus of the present invention is characterized by including reproducing means for reproducing a linear code on ring R recorded by recording means, low-density processing means for performing low-density processing for reducing the density of elements whose values are determined to be one, for a check matrix of the linear code reproduced by the reproducing means, and decoding means for decoding the linear code through a sum product algorithm by using the check matrix whose density is reduced by the low-density processing means.

The linear code may be a linear code subjected to product coding in a predetermined degree and the low-density processing means may perform the low-density processing for the check matrix for each degree, and the decoding means may perform decoding through the sum product algorithm for each degree of the low-density check matrix.

The low-density processing by the low-density processing means and the decoding by the decoding means may be repetitively performed.

A first reproducing method of the present invention is characterized by including a reproducing control step for controlling reproduction of a linear code on ring R recorded on the recording medium, a low-density processing step for performing low-density processing for reducing the density of elements whose values are determined to be one, for a check matrix of the linear code reproduced under the control of the reproducing control step, and a decoding step for decoding the linear code through a sum product algorithm by using the check matrix whose density is reduced through the low-density processing step.

A fifth program of the present invention is characterized in that a computer is made to perform a reproducing control step for controlling reproduction of a linear code on ring R recorded on the recording medium, a low-density processing step for performing low-density processing for reducing the density of elements whose values are determined to be one, for a check matrix of the linear code reproduced under the control of the reproducing control step, and a decoding step for decoding the linear code through a sum product algorithm by using the check matrix whose density is reduced through the low-density processing step.

A second reproducing apparatus of the present invention is characterized by including reproducing means for reproducing a linear code on ring R recorded on a recording medium, and decoding means for decoding the linear code through a sum product algorithm, for a check matrix of the linear code, by using the check matrix, where the density of elements whose values are determined to be one is reduced.

A second reproducing method of the present invention is characterized by including a reproducing control step for controlling reproduction of a linear code on ring R recorded on a recording medium and a decoding step for decoding the linear code through a sum product algorithm, for a check matrix of the linear code, by using the check matrix, where the density of elements whose values are determined to be one is reduced.

A sixth program of the present invention is characterized in that a computer is made to perform a reproducing control step for controlling reproduction of a linear code on ring R recorded on a recording medium and a decoding step for decoding the linear code through a sum product algorithm, for a check matrix of the linear code, by using the check matrix, where the density of elements whose values are determined to be one is reduced.

In the present invention, the density of elements whose values are determined to be one is reduced, for a check matrix of a linear code on ring R, and the linear code is decoded by using a sum product algorithm by using the low-density check matrix.

Further, in the present invention, the linear code is decoded by using the sum product algorithm by using the check matrix, where the density of elements whose values are determined to be one is reduced.

BRIEF DESCRIPTION OF THE DRAWINGS

FIG. 1 illustrates an example low-density parity check matrix.

FIG. 5 illustrates an example check matrix of the LDPC code.

FIG. 9 illustrates a check matrix of a Reed-Solomon code.

FIG. 15 illustrates an example parity check matrix of a BCH code.

FIG. 17 illustrates an example expanded parity check matrix.

FIG. 22 illustrates an example parity check matrix of the Reed-Solomon code.

FIG. 23 illustrates another example expanded parity check matrix.

BEST MODE FOR CARRYING OUT THE INVENTION

Embodiments of the present invention will be described, as below. First, an example technology using the present invention will be described.

Figure 2:
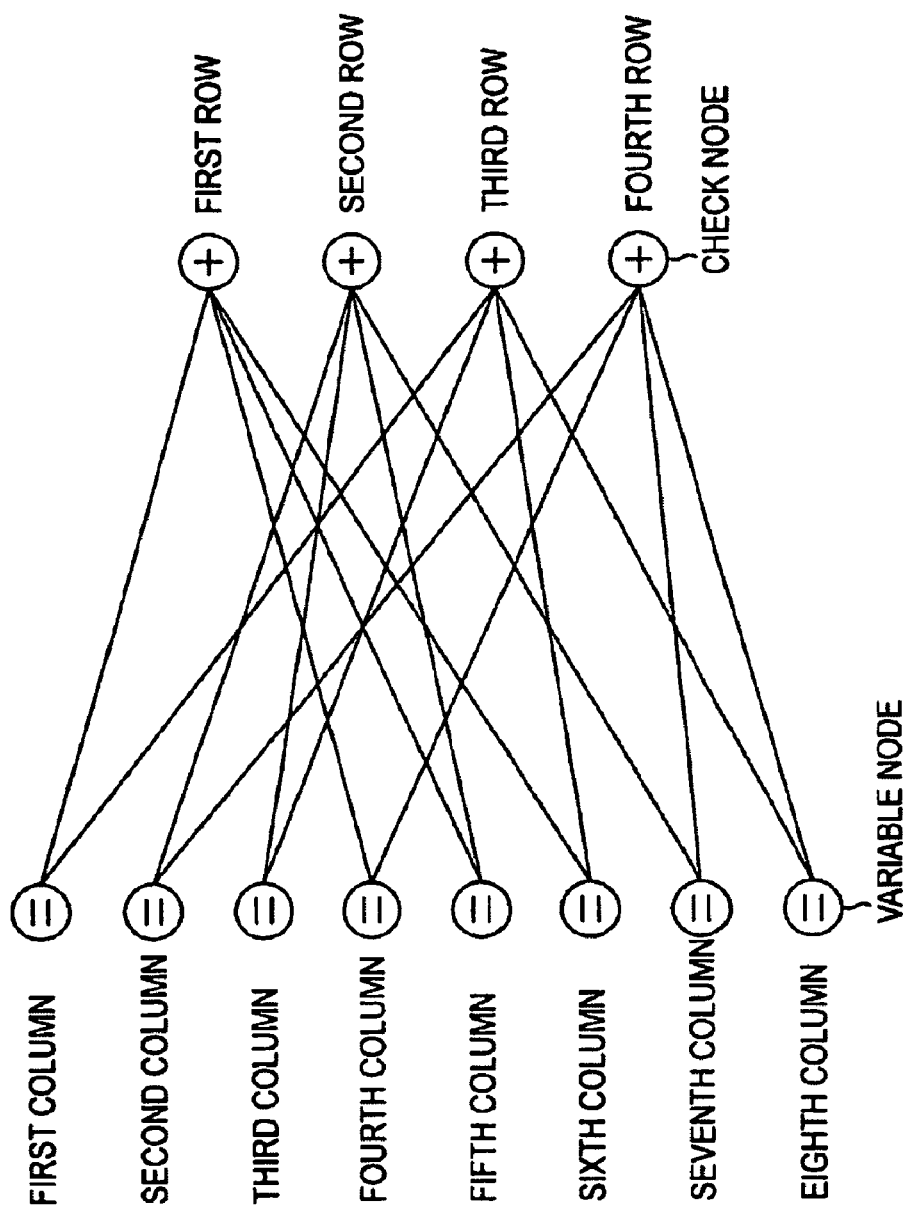
FIG. 2 illustrates a Tanner graph corresponding to the parity check matrix shown in FIG. 1.
Figure 3:
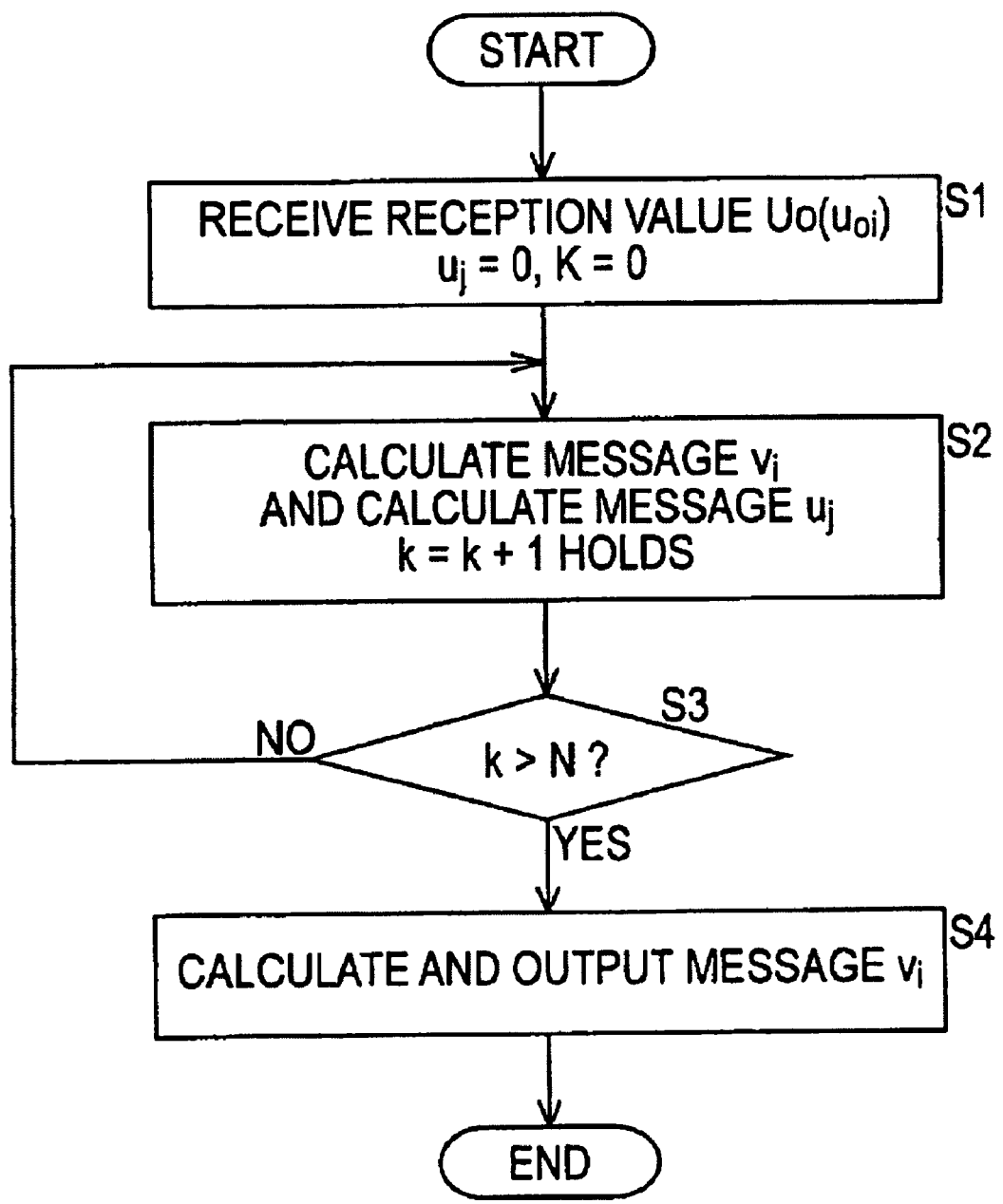
FIG. 3 is a flowchart illustrating procedures for decoding an LDPC code.
Figure 4:
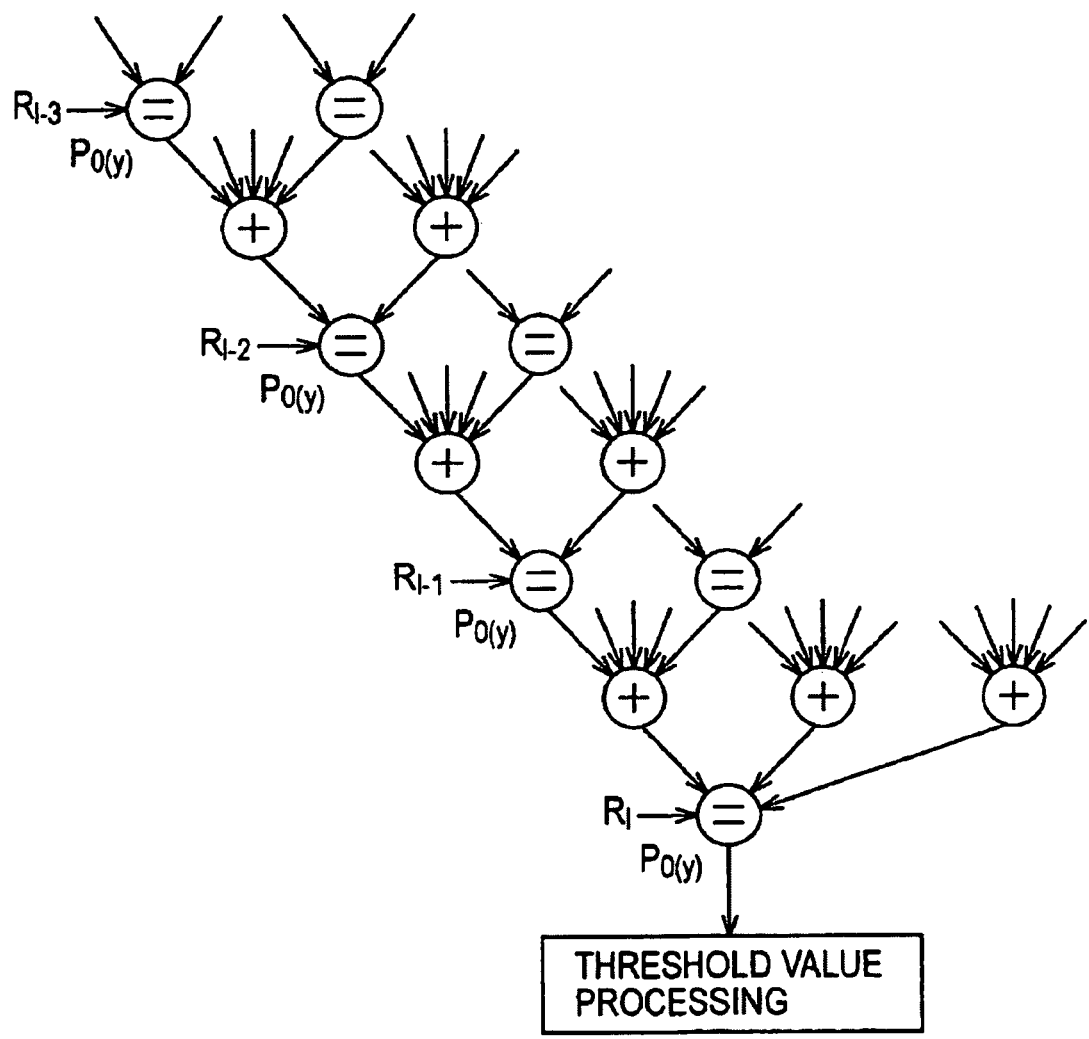
FIG. 4 illustrates the flow of a message.
Figure 6:
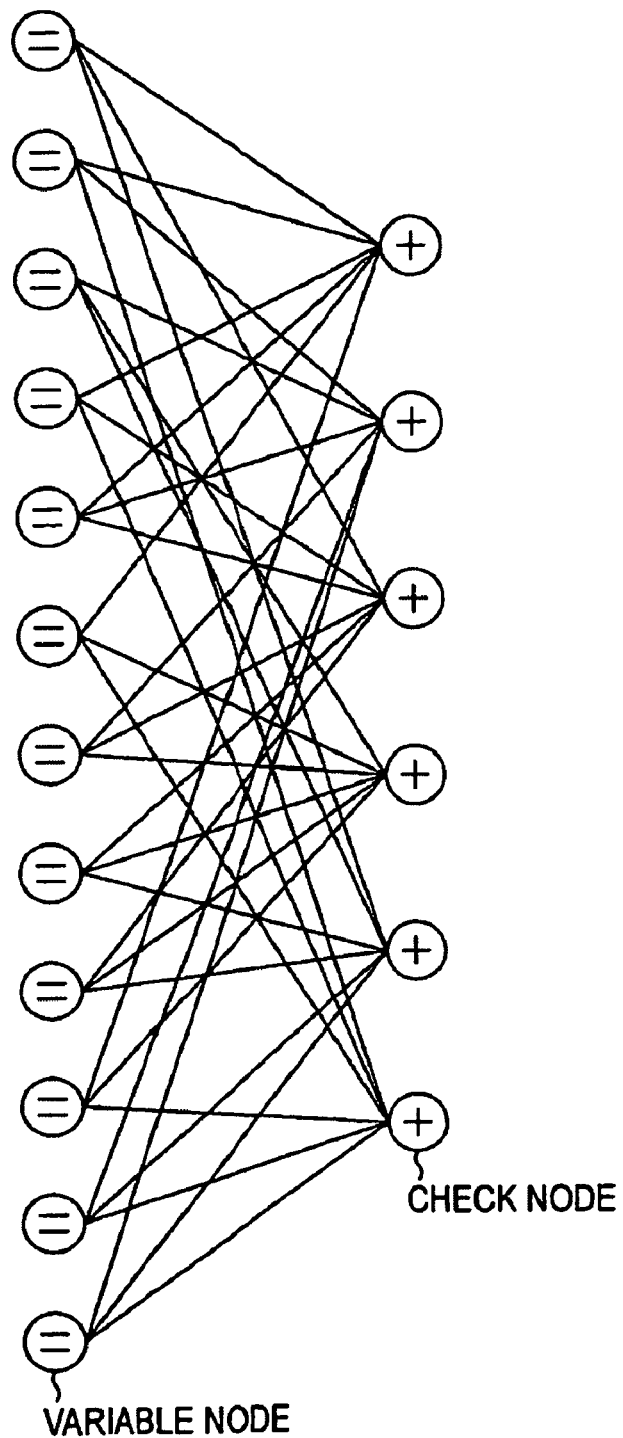
FIG. 6 illustrates a Tanner graph of the check matrix.
Figure 7:
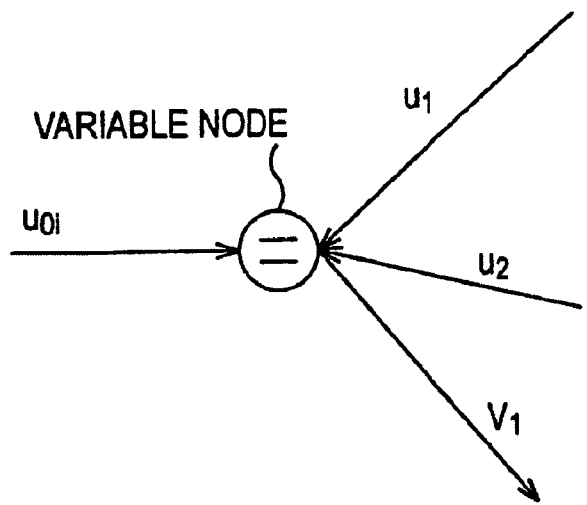
FIG. 7 shows a variable node.
Figure 8:
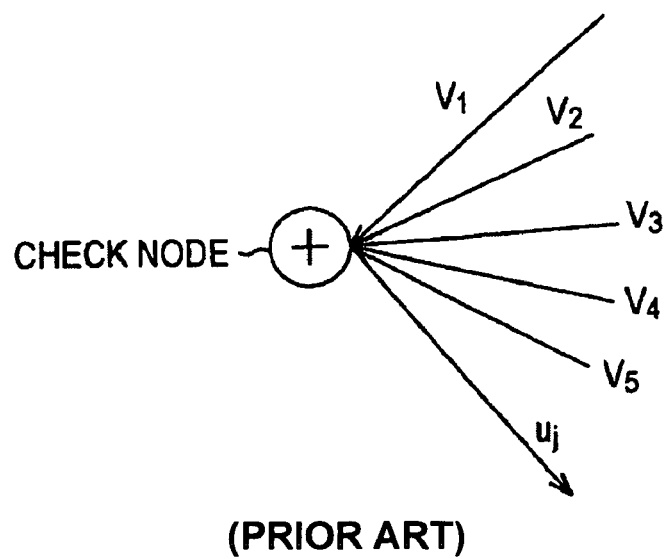
FIG. 8 shows a check node.
Figure 10:
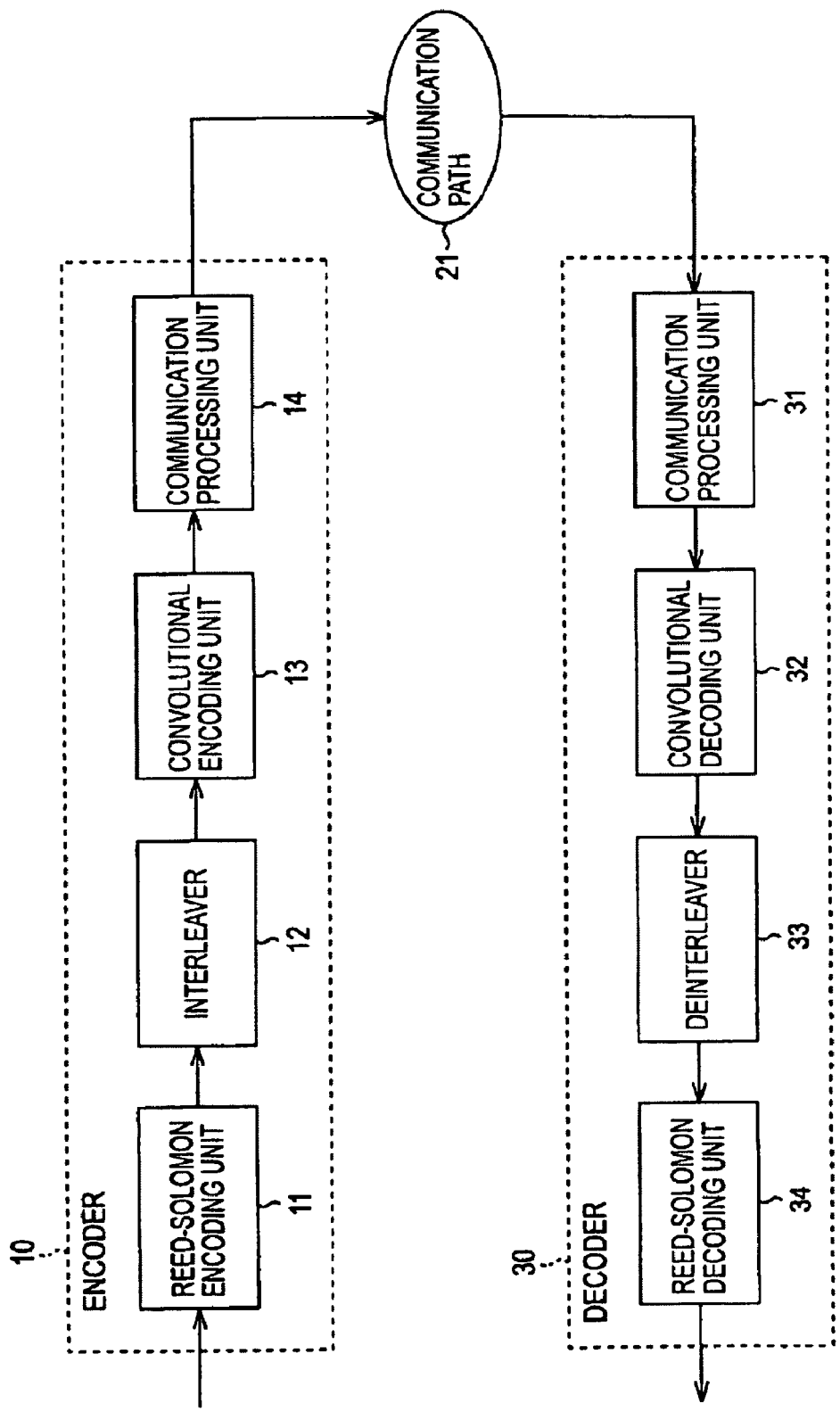
FIG. 10 illustrates the configuration of an example known error correction system.
Figure 11:
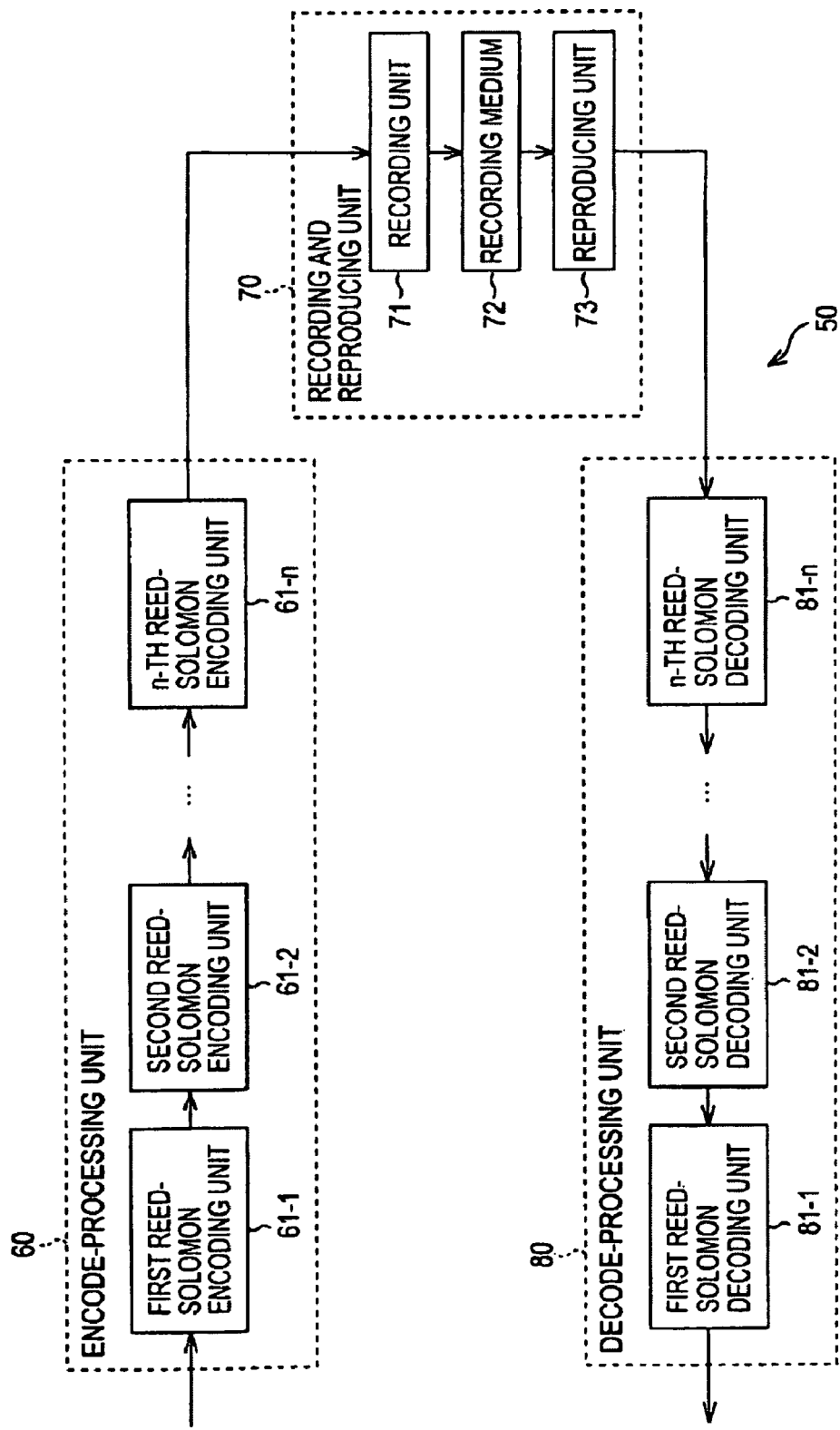
FIG. 11 illustrates the configuration of an example known recording-and-reproducing apparatus.
Figure 12:
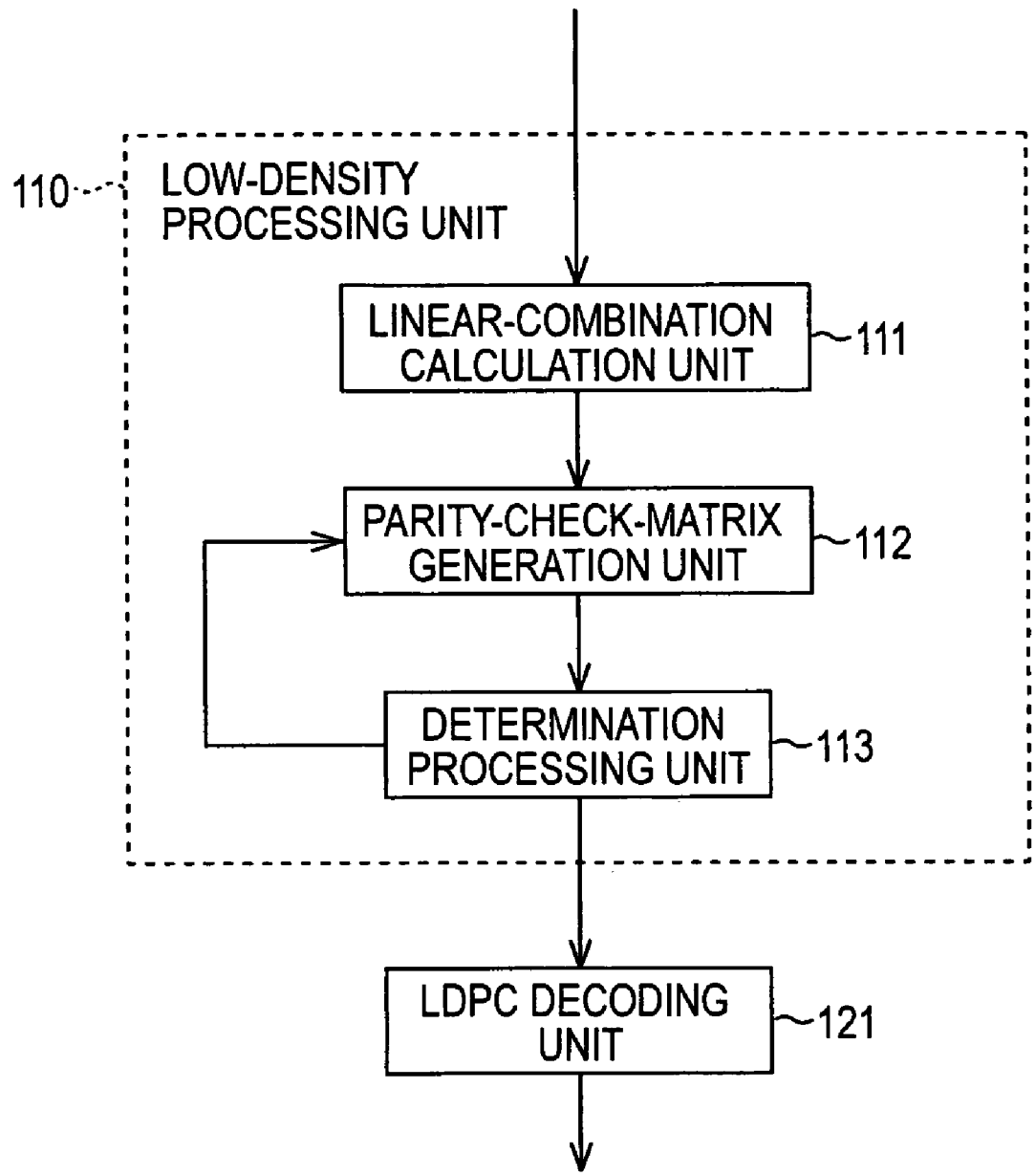
FIG. 12 illustrates the configuration of an example decoder using the present invention.

FIG. 12 is a block diagram illustrating the example configuration of an example decoder using the present invention.

In FIG. 12, a decoder 100 is a decoder that can be used for a BCH code, for example, and that includes a low-density processing unit 110 for converting a parity check matrix of at least one reception word on ring R (or a finite field) into a matrix whose density is sufficiently low and an LDPC decoding unit 121 for decoding the reception word by using the low-density parity check matrix.

The low-density processing unit 110 includes a linear-combination calculation unit 111 for calculating linear combination of rows of the parity check matrix, a parity-check-matrix generation unit 112 for generating a sufficiently sparse parity check matrix by using the linearly combined rows, and a determination unit 113 for determining whether or not the rank of the generated parity check matrix is the same as that of the original parity check matrix.

The linear-combination calculation unit 111 calculates the linear combination of rows of a parity check matrix included in an obtained reception word for all the combinations. That is to say, the linear-combination calculation unit 111 calculates $2^n$-ways of linear combination for a parity check matrix having n rows. The linear-combination calculation unit 111 transmits the calculation result and the reception words to the parity-check-matrix generation unit 112.

The parity-check-matrix generation unit 112 extracts rows from the calculation result transmitted from the linear-combination calculation unit 111, that is, the linearly combined rows, from predetermined criteria, and generates a parity check matrix including the extracted rows. The parity-check-matrix generation unit 112 sets predetermined criteria so that the density of the generated parity check matrix becomes low. For example, it may be arranged that a predetermined row is extracted from the linearly combined rows, where the number of elements whose values are "1" is less than a predetermined number. Then, the parity-check-matrix generation unit 112 extracts at least one row meeting the criteria. The parity-check-matrix generation unit 112 transmits the generated parity check matrix and the reception word to the determination unit 113. Further, as will be described later, where the determination unit 113 determines that the rank of the generated parity check matrix is different from that of the original parity check matrix, the parity-check-matrix generation unit 112 performs the row extraction again, and generates a new parity check matrix. At that time, the parity-check-matrix generation unit 112 changes the criteria for the previous row extraction and generates a parity check matrix including rows different from those of the previously generated parity check matrix.

The determination unit 113 determines whether or not the rank of the parity check matrix generated by the parity-check-matrix generation unit 112 agrees with that of the original parity check matrix. Where it is determined that the ranks agree with each other, the determination unit 113 transmits the reception word and the generated parity check matrix to the LDPC decoding unit 121. Where it is determined that the ranks do not agree with each other, the determination unit 113 switches the processing back to the parity-check-matrix generation unit 112, so that the parity-check-matrix generation unit 112 generates another new parity check matrix.

As has been described, the low-density processing unit 110 reduces the density of the parity check matrix of the BCH code included in the reception word and transmits the low-density parity check matrix and the reception word to the LDPC decoding unit 121.

The LDPC decoding unit 112 decodes the reception words according to a sum product algorithm by using the obtained low-density parity check matrix and externally outputs the decoded reception word outside the decoder 100.

As described above, the low-density processing unit 110 reduces the density of the parity check matrix of the reception words, whereby the LDPC decoding unit 121 can perform decoding using the sum product algorithm by using the low-density parity check matrix. Subsequently, high-performance decoding can be performed. Further, since the low-density processing unit 110 reduces the density of the parity check matrix of the reception word through linear combination, the LDPC decoding unit 121 can perform decoding on a subfield and reducing the operation cost. That is to say, since the density of the parity check matrix is reduced through the linear combination before performing the decoding using the sum product algorithm, the decoder 100 can easily perform high-performance decoding.

Next, decoding performed by the above-described decoder will be described with reference to a flowchart shown in FIG. 13.

First, the low-density processing unit 110 of the decoder 100 performs parity-check-matrix low-density processing, at step S21, so as to reduce the density of a parity check matrix included in an obtained reception word. The details of the parity-check-matrix low-density processing will be described later with reference to a flowchart of FIG. 14.

Then, at step S22, the LDPC decoding unit 121 performs decoding using the sum product algorithm (SPA) by using the parity check matrix whose density is reduced through the processing at step S21. Where the processing at the step S22 is finished, the LDPC decoding unit 121 terminates decoding for the reception word. Further, the decoder 100 performs the above-described decoding for each reception word (each block).

Next, the details of the parity-check-matrix low-density processing performed at step S21 shown in FIG. 13 will be described with reference to the flowchart of FIG. 14.

First, at step S41, the linear-combination calculation unit 111 of the low-density processing unit 110 linearly combines the rows of the parity check matrix included in the obtained reception word in all possible ways and calculates the combination result.

After calculating the linear combination, the linear-combination calculation unit 111 sets the value of a variable n functioning as the criteria of row extraction, as will be described later, to an initial value such as "1", at step S42. Then, the linear-combination calculation unit 111 transmits the reception word, the linear-combination calculation result, and the variable n to the parity-check-matrix generation unit 112, so that the processing advances to step S43.

At step S43, the parity-check-matrix generation unit 112 calculates weight indicating the number of elements whose values are determined to be "1" for each of the obtained linear-combination results, extracts rows with predetermined weight from among all the linear-combination results, where the extracted weight indicating the number of elements whose values are determined to be "1" is less than the variable n, and generates a low-density parity check matrix including the extracted rows.

That is to say, the parity-check-matrix generation unit 112 extracts a subset of vectors with lower weights, where the subset forms a code complementary space, from among the set of vectors obtained through the linear combination calculated by the linear-combination calculation unit 111, and generates a new parity check matrix including all the vectors of the vector subset, where the vectors function as row elements.

After generating the new parity check matrix, the parity-check-matrix generation unit 112 advances the processing to step S44, adds "1" to the value of variable n, and transmits the reception word, the generated parity check matrix, and the variable n to the determination unit 113.

Upon receiving the reception word, the generated parity check matrix, and the variable n, the determination unit 113 determines whether or not the rank of the original parity check matrix agrees with the rank of the low-density parity check matrix based on information relating to the original parity check matrix included in the reception word, at step S45.

Figure 13:
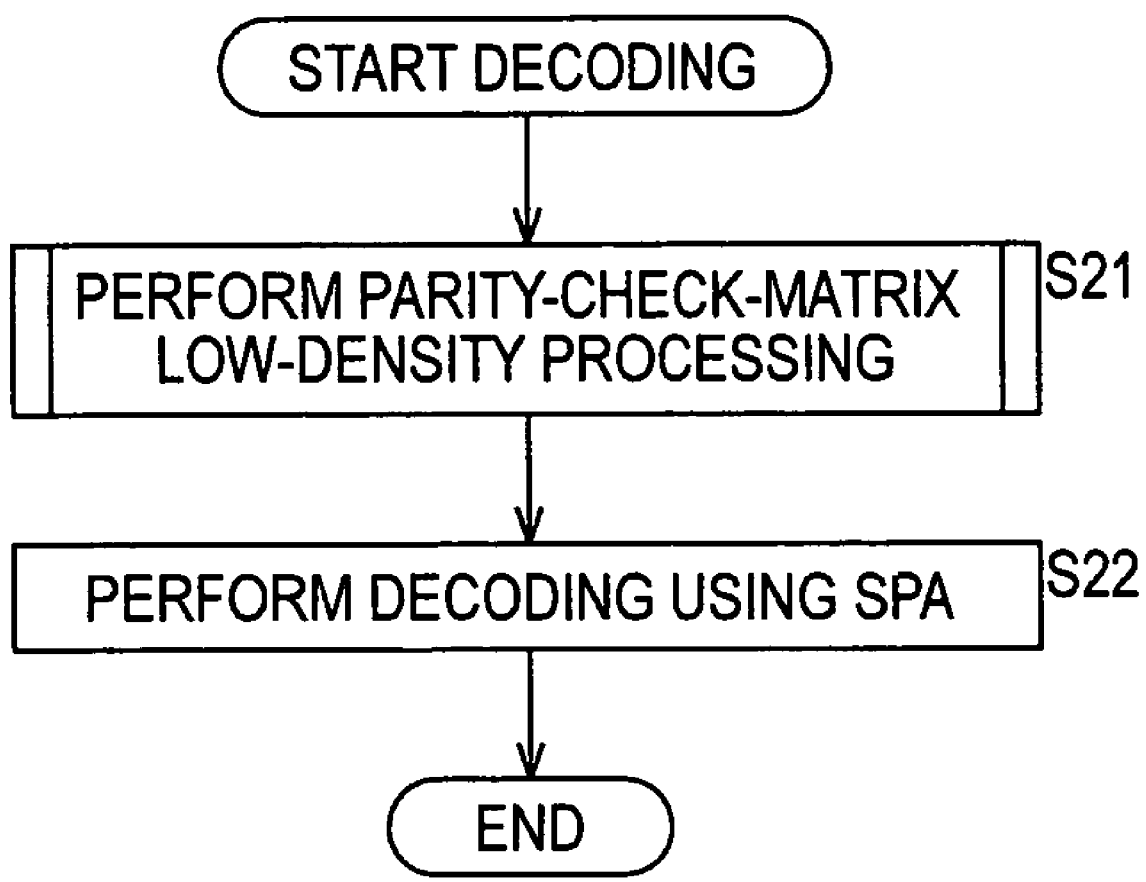
FIG. 13 is a flowchart illustrating decoding processing performed by the decoder shown in FIG. 12.
Figure 14:
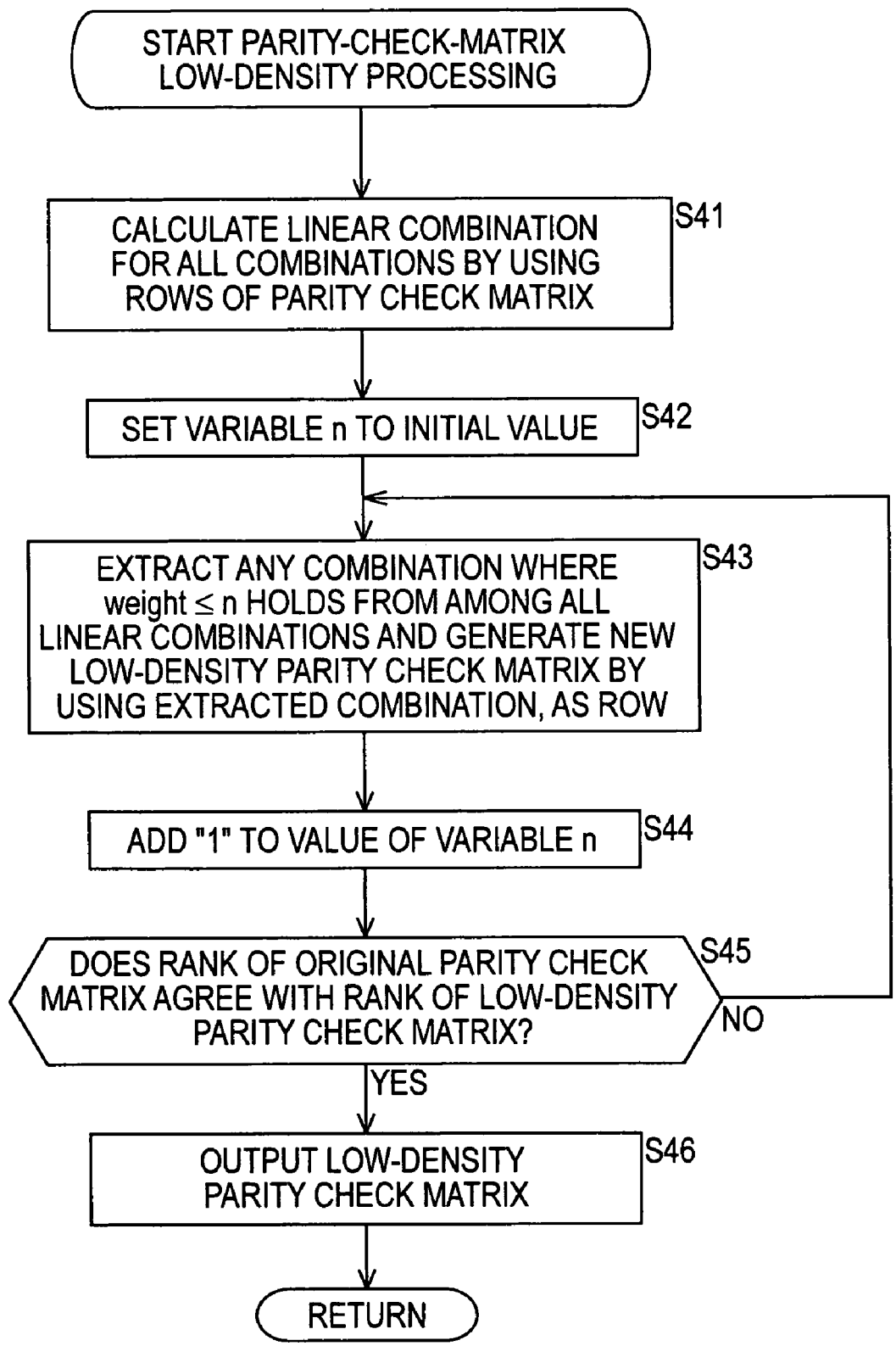
FIG. 14 is a flowchart illustrating parity-check-matrix low-density processing performed at step S21 shown in FIG. 13.

For example, where it is determined that the rank of the low-density parity check matrix is low and does not agree with that of the original parity check matrix, the determination unit 113 returns to step S43 and repeats the processing from then on. That is to say, the determination unit 113 transmits its determination result to the parity-check-matrix generation unit 112 and makes the parity-check-matrix generation unit 112 regenerate a low-density parity check matrix. At that time, the value of variable n functioning as the criteria of extraction from the linear-combination result is different from that of the previous processing. Therefore, the parity-check-matrix generation unit 112 can generate a low-density parity check matrix having rows different from those of the previous processing (elements different from those of the previous processing).

Where it is determined that the rank of the original parity check matrix agrees with that of the low-density parity check matrix, at step S45, the determination unit 113 advances to step S46, transmits the reception words and the generated low-density parity check matrix to the LDPC decoding unit 121, and returns to step S22 shown in FIG. 13.

By performing the decoding and the parity-check-matrix low-density processing in the above-described manner, the decoder 100 reduces the density of the parity check matrix through linear combination before performing the decoding using the sum product algorithm. Therefore, the decoder 100 can easily perform high-performance decoding.

Next, example density reduction using the above-described decoder 100 will be described in detail.

In the following example, a finite field is determined to be a finite field $GF(2^4)$ whose elements are powers of prime numbers (an extension field of degree 4 of $GF(2)$), a linear code is indicated by C, and a (15, 7)-BCH code whose code length and data length are determined to be fifteen and seven is decoded.

Figure 16:
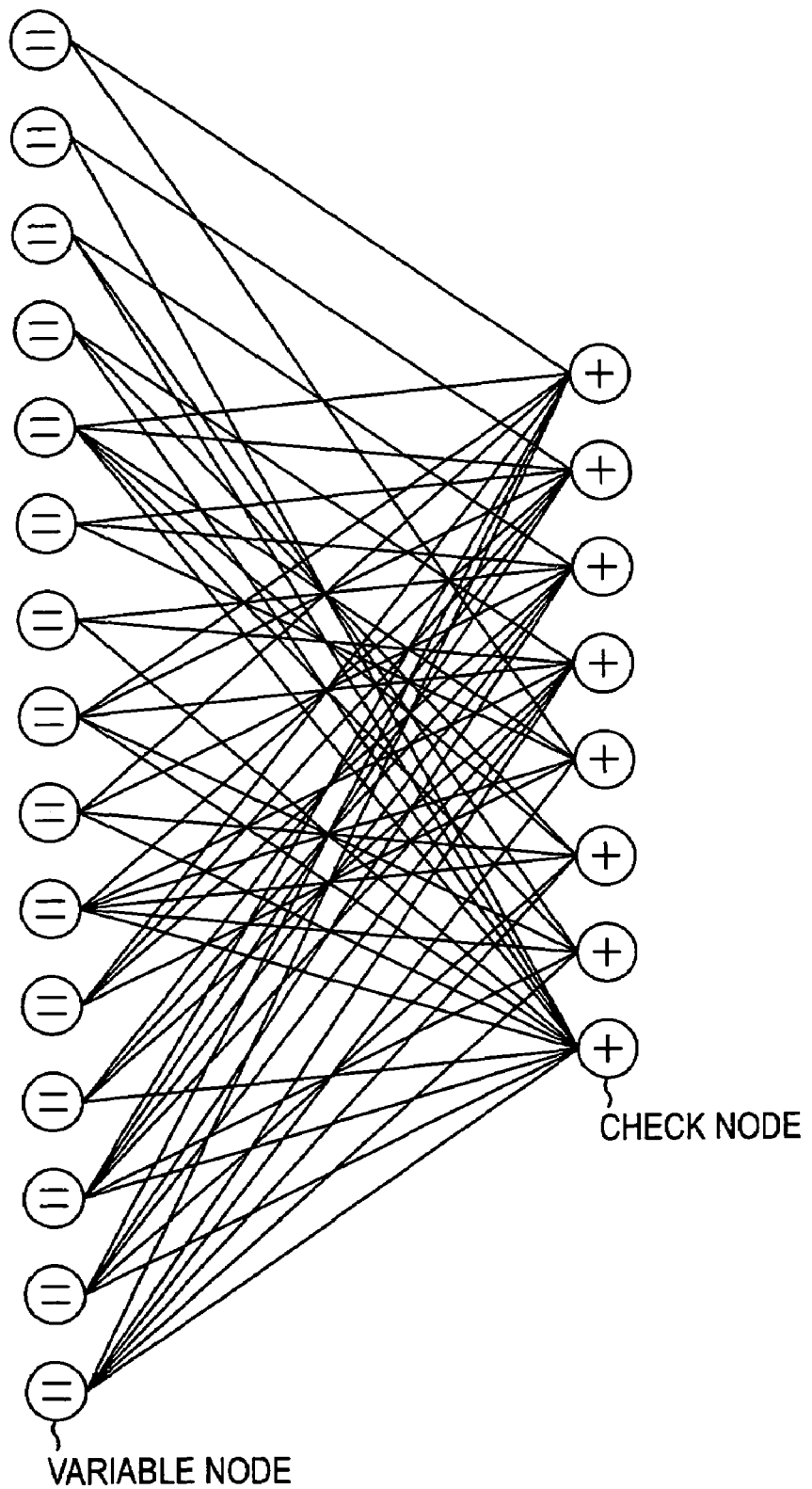
FIG. 16 illustrates a Tanner graph corresponding to the parity check matrix shown in FIG. 15.

A parity check matrix H of the linear code C is provided, as shown in FIG. 15, for example. The parity check matrix H shown in FIG. 15 is a matrix including eight rows and fifteen columns. A Tanner graph corresponding to the parity check matrix H is provided, as shown in FIG. 16. In the Tanner graph shown in FIG. 16, each column of the parity check matrix H is shown as a variable node indicated by "=" and each row is shown as a check node indicated by "+". The density of edges connecting the variable nodes to the check nodes is high, which shows that the parity check matrix H shown in FIG. 15 is not a low-density matrix.

Figure 18:
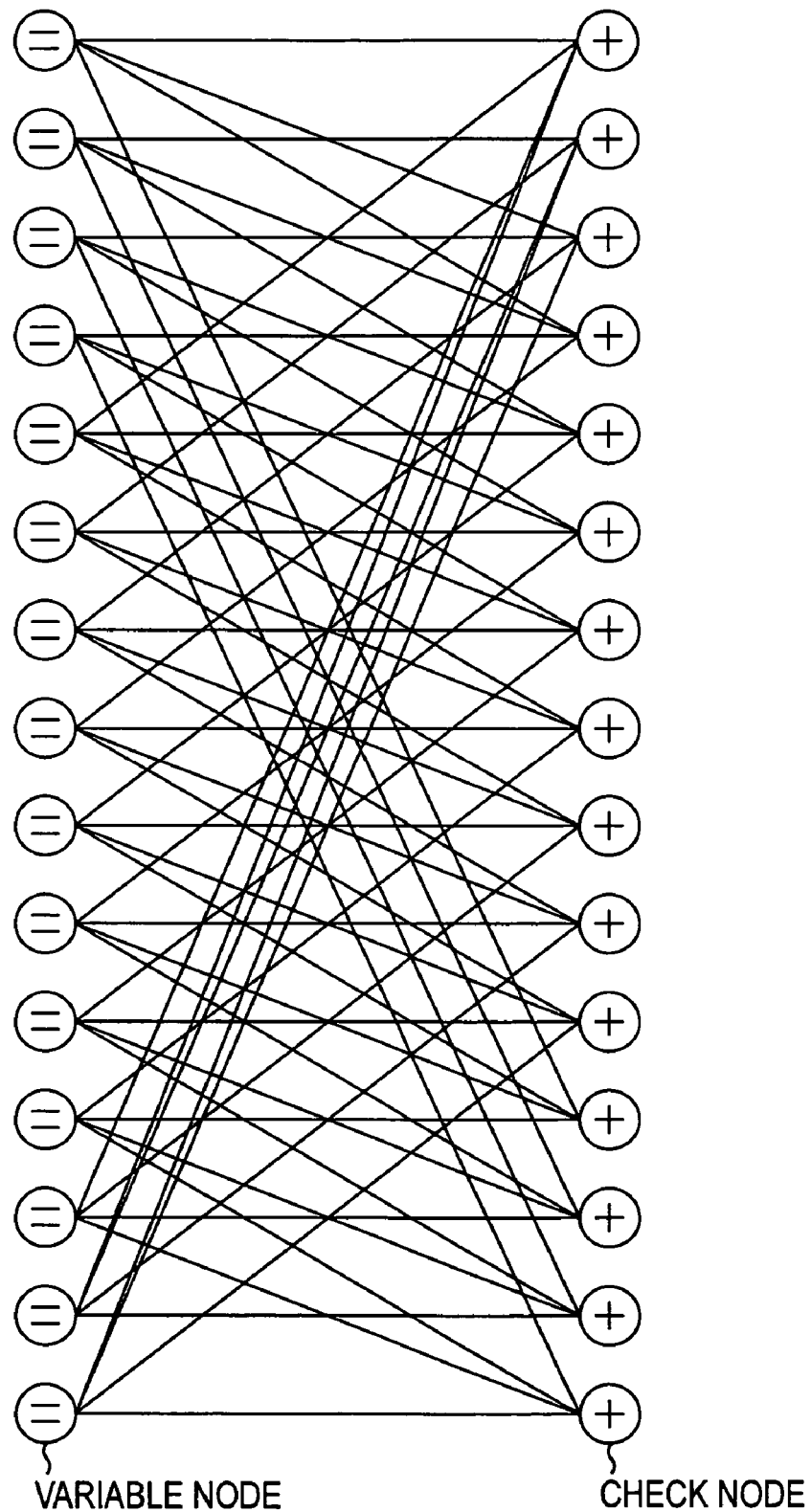
FIG. 18 illustrates a Tanner graph corresponding to the parity check matrix shown in FIG. 17.

As described above, the low-density processing unit 110 shown in FIG. 12 performs linear combination by using the above-described eight rows and generates $2^8=256$ pieces of row vectors whose "1"-density is low. Then, the low-density processing unit 110 extracts fifteen pieces of row vectors, where the number of "1" is four or less, and generates a new matrix $H_{sp4}$ including vertically-aligned fifteen-element vectors, as shown in FIG. 17. FIG. 18 shows a Tanner graph corresponding to the matrix $H_{sp4}$ shown in FIG. 17. Since both the row number and the column number of matrix $H_{sp4}$ shown in FIG. 17 are fifteen, both the variable-node number and check-node number of the Tanner graph shown in FIG. 18 are fifteen. That is to say, the density of edges connecting the variable nodes to the check nodes is lower than in the case of FIG. 16.

The low-density processing unit 110 determines the above-described matrix $H_{sp4}$ to be a parity check matrix and transmits the matrix $H_{sp4}$ to the LDPC decoding unit 121. The LDPC decoding unit 121 decodes the reception word by using the sum product algorithm by using the low-density parity check matrix $H_{sp4}$ shown in FIG. 17.

Figure 19:
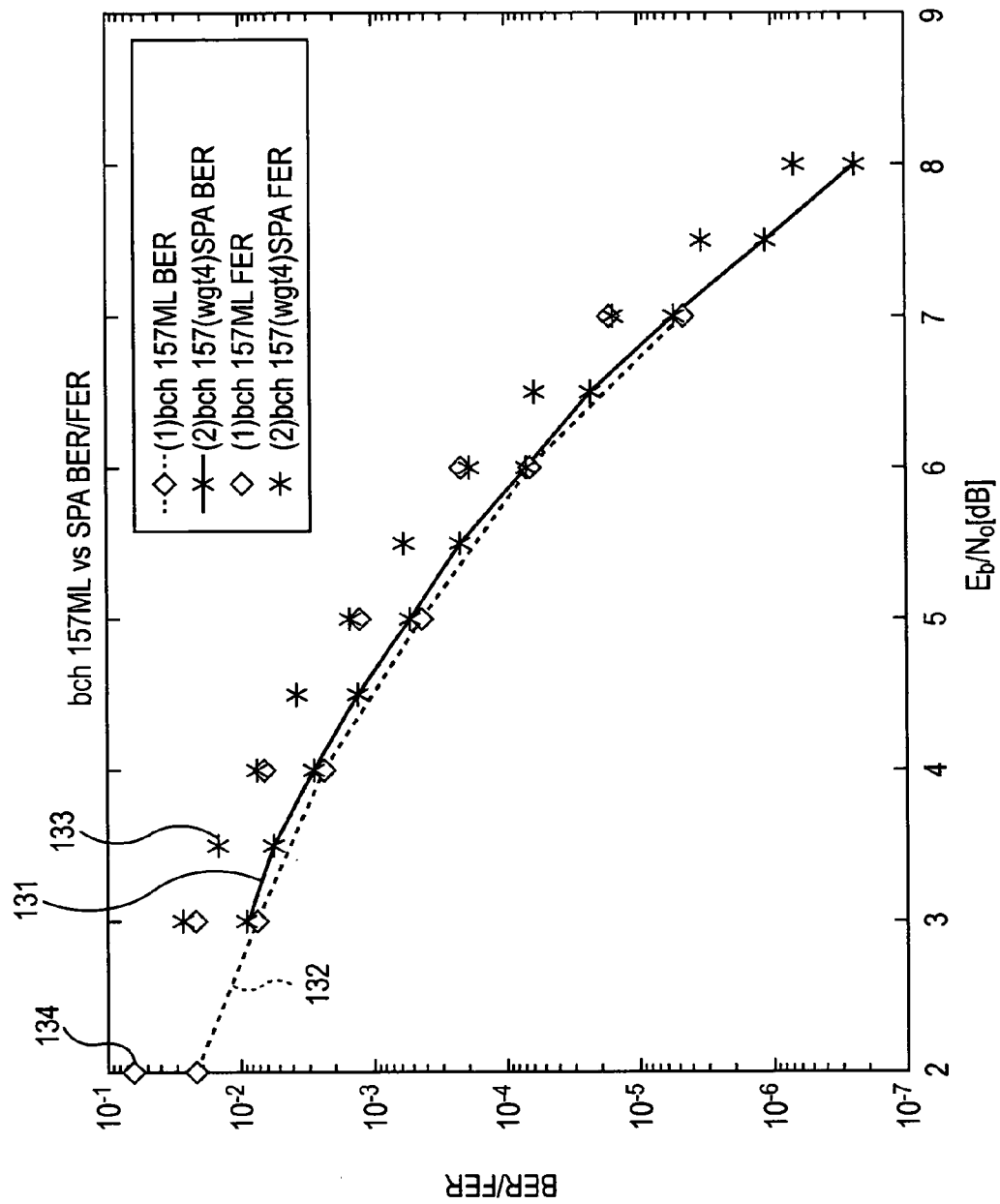
FIG. 19 is a graph showing decoding comparisons.

FIG. 19 is a graph showing a comparison between the case where the BCH code including the above-described parity check matrix is decoded in a maximum-likelihood manner through Viterbi decoding and the case where the BCH code is decoded by using the sum product algorithm by using the low-density parity check matrix $H_{sp4}$ shown in FIG. 17.

In FIG. 19, a curve 131 shows the bit-error rate (BER) of the decoding result by using the sum product algorithm (SPA) ((2) bch 15 7(wgt4) SPA BER) and a curve 132 indicates the bit-error rate (BER) of the decoding result obtained by Viterbi decoding ((1) bch 15 7 ML BER). Further, data plotted by a point 133 indicates a frame-error rate (FER) of the result of decoding by using the sum product algorithm ((2) bch 15 7(wgt4) SPA FER) and data plotted by a point 134 indicates a frame-error rate (FER) of the decoding result obtained by Viterbi decoding ((1) bch 15 7 ML FER).

The maximum-likelihood decoding (the curve 132 shown in FIG. 19) indicates the performance limit obtained in the case where probability decoding such as the sum product algorithm is used. The curve 131 using the present invention indicates performance growing closer to the performance limit, as shown in FIG. 19.

As described above, the decoder 100 reduces the density of the parity check matrix through linear combination before decoding the BCH code by using the sum product algorithm. Subsequently, the decoder 100 can easily perform high-performance decoding.

Although the BCH-code decoding has been described, any code method may be used without being limited thereto, as long as a widely-used linear code such as a Reed-Solomon code is used. The case where the Reed-Solomon signal is decoded by using the sum product algorithm will now be described, as below.

Figure 20:
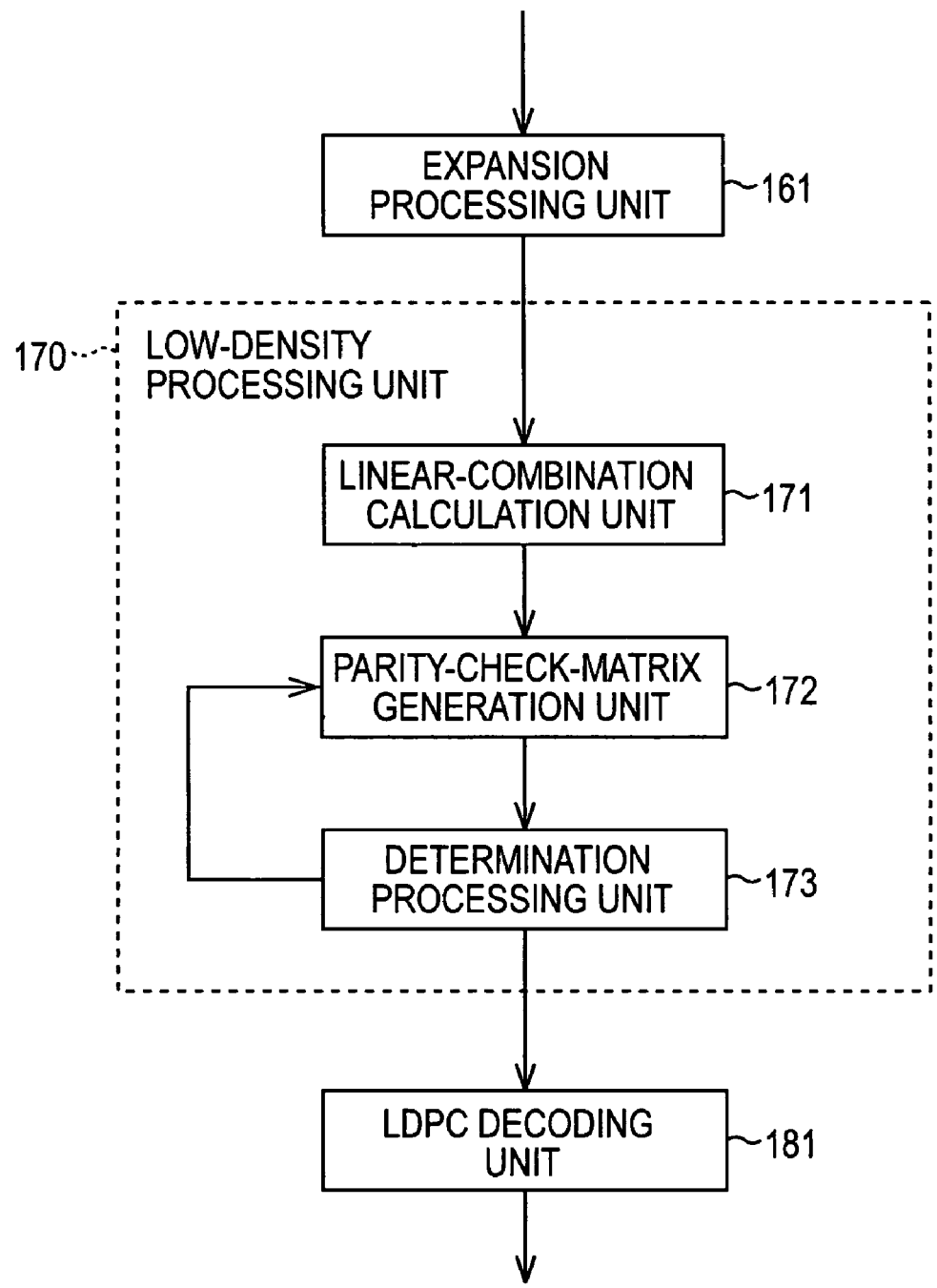
FIG. 20 illustrates the configuration of another example decoder using the present invention.

FIG. 20 is a block diagram showing the configuration of another example decoder using the present invention.

In FIG. 20, a decoder 150 is a decoder compliant to the Reed-Solomon code, for example, and includes an expansion unit 161 for expanding the parity check matrix of a reception word, a low-density processing unit 170 for converting the expanded parity check matrix into a matrix whose density is sufficiently low, and an LDPC decoding unit 181 for decoding the reception word using the low-density parity check matrix.

The expansion processing unit 161 expands each of the elements of a parity check matrix included in an obtained reception word to a predetermined degree according to the degree of a finite field of the matrix, as preprocessing of low-density processing for the parity check matrix. That is to say, the expansion processing unit 161 expands the parity check matrix on the finite field whose elements are powers of prime numbers on a subfield of the finite field in predetermined degrees. The low-density processing unit 161 transmits the expanded parity check matrix and the reception word to the low-density processing unit 170.

The low-density processing 170 includes a linear-combination calculation unit 171 for calculating linear combination of rows of the parity check matrix, a parity-check-matrix generation unit 172 for generating a sufficiently sparse parity check matrix by using the linearly combined rows, and a determination unit 173 for determining whether or not the rank of the generated parity check matrix is the same as that of the original parity check matrix. Since the configuration and operations of each of the above-described units are the same as those of the low-density processing unit 110 of the decoder 100 shown in FIG. 12, the description thereof is omitted. That is to say, the units including the linear-combination calculation unit 171 to the determination unit 173 of the low-density processing unit 170 correspond to those including the linear-combination calculation unit 111 to the determination limit 113 shown in FIG. 12. However, the low-density processing unit 170 performs low-density processing for the expanded parity check matrix transmitted from the expansion unit 161.

The low-density processing unit 170 reduces the density of the parity check matrix of the Reed-Solomon code expanded by the expansion processing unit 161 and transmits the low-density parity check matrix and the reception word to the LDPC decoding unit 181.

The LDPC decoding unit 181 decodes the reception word through the sum product algorithm by using the obtained low-density parity check matrix and outputs the decoded reception word outside the decoder 150.

Thus, since the expansion processing unit 161 expands the parity check matrix before the low-density processing unit 170 reduces the density of the parity check matrix, the operation cost of decoding performed by the LDPC decoding unit 181 through the sum product algorithm by using the low-density parity check matrix $H_{sp24}$ is reduced to about one quarter the operation cost in the case where decoding is performed through the sum product algorithm by using the parity check matrix H included in the reception word, as shown in Equation (8) that follow.

$$\{SPA\ ON\ H_{sp24}\} \sim \frac{1}{4} \{SPA\ ON\ H\} \qquad \text{Equation (8)}$$

Subsequently, the decoder 150 can easily perform high-performance decoding.

Figure 21:
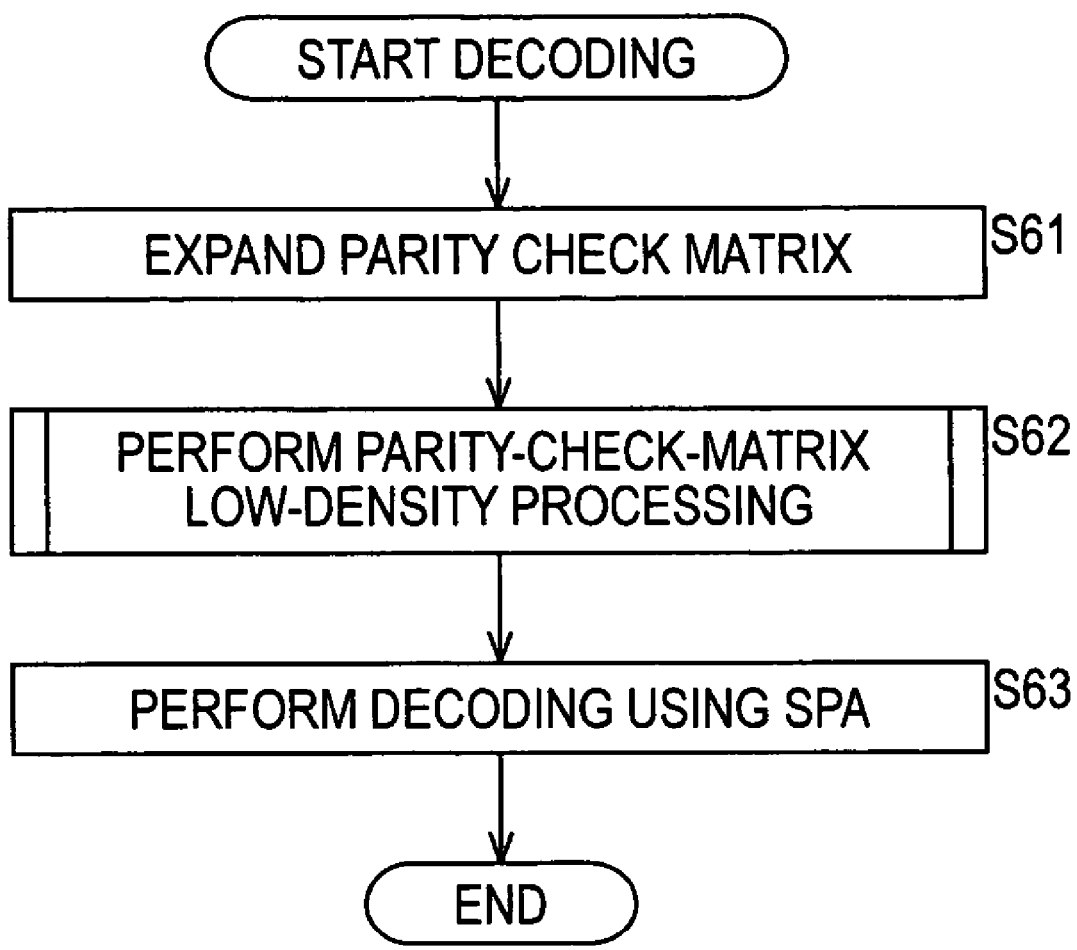
FIG. 21 is a flowchart illustrating decoding processing performed by the decoder shown in FIG. 20.

Next, the decoding performed by the above-described decoder 150 will be described with reference to a flowchart shown in FIG. 21.

First, the expansion processing unit 161 of the decoder 150 expands a parity check matrix included in an obtained reception word according to the degree of the finite field thereof, at step S61. Then, the expansion processing unit 161 transmits the expanded parity check matrix and the reception word to the low-density processing unit 170, so that the processing advances to step S62.

The low-density processing unit 170 performs the parity-check-matrix low-density processing, at step S62, so that the density of the expanded parity check matrix is reduced. Since the details of the parity-check-matrix low-density processing are the same as those described with reference to the flowchart shown in FIG. 14, the detailed description is omitted. However, in the above-described parity-check-matrix low-density processing, the low-density processing unit 170 reduces the density of the parity check matrix expanded by the expansion processing unit 161 in the above-described manner.

Then, at step S63, the LDPC decoding unit 181 performs decoding through the sum product algorithm (SPA) by using the parity check matrix whose density is reduced through the processing performed, at step S62. After the processing at the step S63 is finished, the LDPC decoding unit 121 terminates decoding for the reception word. The decoder 150 performs the above-described decoding for each reception word (each block).

By performing the decoding in the above-described manner, the decoder 150 expands each element of the parity check matrix before performing the density reduction. Subsequently, the decoder 150 can easily perform high-performance decoding.

Next, example expansion performed through the above-described decoder 150 will be described in detail.

In the following example, a finite field is determined to be $GF(2^4)$, a linear code is indicated by C, and a (15, 11)-Reed Solomon code whose code length is determined to be fifteen and data length is determined to be eleven is decoded. Further, the primitive root of $GF(2^4)$ is determined to be a, a primitive polynomial including the primitive root a is provided, as Equation (9), and a code-generation polynomial is provided, as Equation (10).

$$\alpha^4 + \alpha + 1 = 0 \qquad \text{Equation (9)}$$

$$g(x) := (x+1)(x+\alpha)(x+\alpha^2)(x+\alpha^3) \qquad \text{Equation (10)}$$

A parity check matrix of the linear code C at that time is provided, as shown in FIG. 22. The parity check matrix H shown in FIG. 22 is a matrix including four rows and fifteen columns. Since the finite field $GF(2^4)$ is an extension field of degree 4 of GF(2), all the elements and columns on the finite field $GF(2^4)$ can be expanded in degree four. The expansion processing unit 161 of the decoder 150 expands and converts the parity check matrix H shown in FIG. 22 into a parity check matrix $H_{exp}$ having sixteen rows and sixty columns, as shown in FIG. 23. In that case, the expansion processing unit 161 expands each element of the parity check matrix H shown in FIG. 22 into a 4-by 4-element group, whereby the parity check matrix $H_{exp}$ shown in FIG. 23 is generated.

The low-density processing unit 170 of the decoder 150 performs density reduction for the expanded parity check matrix $H_{exp}$. The LDPC decoding unit 181 performs decoding through the sum product algorithm by using the low-density parity check matrix $H_{exp}$.

Figure 24:
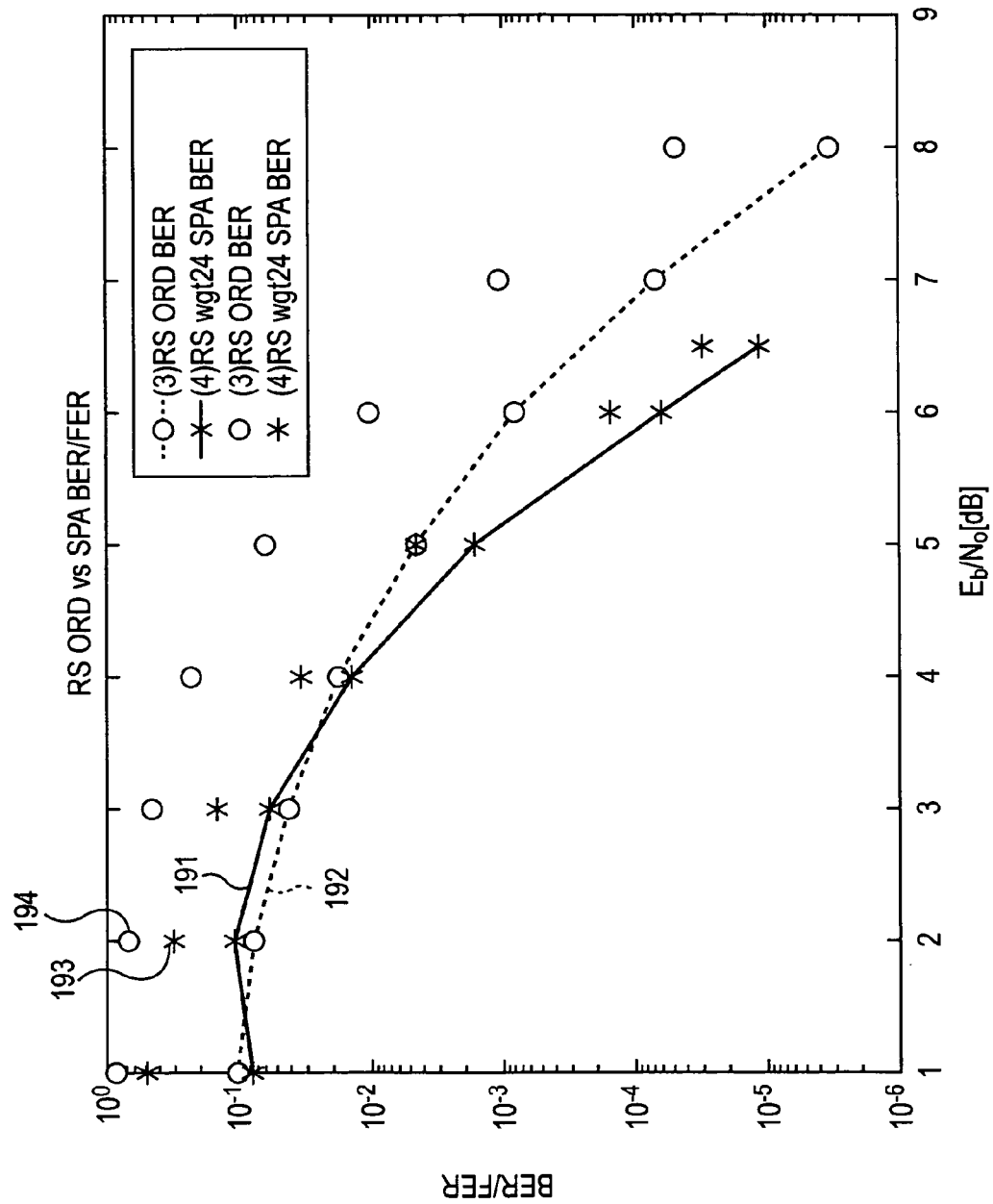
FIG. 24 is another graph showing decoding comparisons.

FIG. 24 is a graph showing a comparison between decoding performance obtained where a Reed-Solomon code including the above-described parity check matrix is decoded through ordinary decoding and that obtained where the Reed-Solomon code is decoded through the sum product algorithm by using the parity check matrix $H_{sp24}$ obtained by reducing the density of the expanded parity check matrix $H_{exp}$ shown in FIG. 23.

In FIG. 24, a curve 191 shows a bit-error rate (BER) of the result of decoding performed through the sum product algorithm (SPA) by using the low-density parity check matrix $H_{sp24}$ ((4) RS wgt24 SPA BER) and a curve 192 indicates a bit-error rate (BER) of the result of ordinary decoding ((3) RS ORD BER). Further, data plotted by a point 193 indicates a frame-error rate (FER) of the result of decoding performed through the sum product algorithm by using the low-density parity check matrix $H_{sp24}$ ((4) RS wgt24 SPA FER) and data plotted by a point 194 indicates a frame-error rate (FER) of the result of ordinary decoding ((3) RS ORD FER).

The curve 191 (the point 193) denoting the result of decoding using the present invention shows performance higher than that of the curve 192 (the point 194) denoting the result of ordinary decoding, as shown in FIG. 24.

As has been described, the decoder 150 reduces the density of the parity check matrix through linear combination before decoding the Reed-Solomon code by using the sum product algorithm. Therefore, the decoder 150 can easily achieve high-performance decoding. Further, the decoder 150 expands each of the elements and columns of the parity check matrix before reducing the density of the parity check matrix. Subsequently, the operation cost can be reduced.

Figure 25:
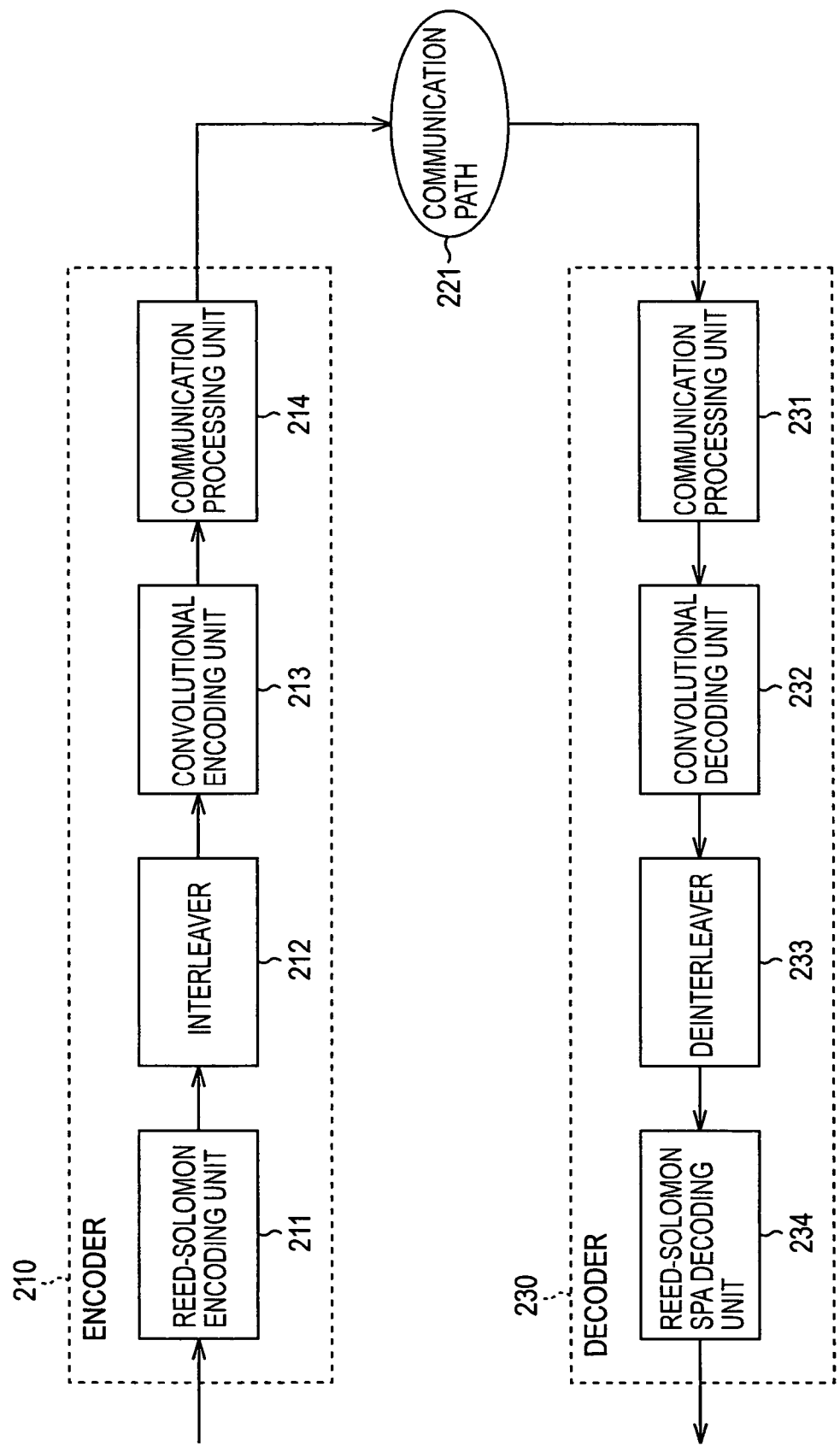
FIG. 25 is a block diagram illustrating the configuration of an example error correction system using the present invention.

FIG. 25 is a block diagram showing the configuration of an example error correction system using a Reed-Solomon code. The error correction system shown in FIG. 25 is a system used for a digital-communication system such as a digital TV, for example.

In the error correction system shown in FIG. 25, digital data transmitted from an encoder 210 on the transmission side is transmitted to a decoder 230 on the reception side via a communication path 221 such as the Internet, for example.

The encoder 210 includes a Reed-Solomon encoding unit 211 for encoding externally transmitted digital data for transmission by using the Reed-Solomon code, an interleaver 212 for rearranging the encoded digital data, a convolution encoding unit 213 for performing convolutional encoding, and a communication unit 214 for communicating with the decoder 230 via the communication path 221.

The Reed-Solomon encoding unit 211 encodes the digital data transmitted from outside the encoder 210 by using the Reed-Solomon code and transmits the encoded digital data to the interleaver 212. The interleaver 212 rearranges the encoded digital data (interleaving) for diffusing burst errors that occur mainly in the communication path 221. Since the Reed-Solomon code performs error correction, where a plurality of bits is rearranged, as a single symbol, the interleaver 212 performs symbol interleaving for diffusing burst errors in symbols. After finishing the data rearranging, the interleaver 212 transmits the rearranged digital data to the convolutional-encoding unit 213.

The convolutional-encoding unit 213 refers to data that was encoded in the past for the rearranged digital data and performs convolutional encoding based on a plurality of data blocks, whereby a code sequence is set in order. For example, upon receiving the digital data for each k-bit data block from the interleaver 212, the convolutional-encoding unit 213 with a constraint length K encodes the digital data to an n-bit code block based on not only the data block transmitted at that time but also K data blocks including data blocks that had been provided. After the convolutional encoding is finished, the convolutional-encoding unit 213 transmits the convolutional-encoded digital data to the communication unit 214.

The communication unit 214 performs communication control processing and transmits the transmitted digital data to the decoder 230, as a transmission word via the communication path 221 based on a predetermined protocol.

The digital data transmitted from the encoder 210 is transmitted to the decoder 230 via the communication path 221.

The decoder 230 includes a communication unit 231 for receiving the digital data transmitted via the communication path 221, as a reception word, a convolutional-decoding unit 232 for performing convolutional decoding for the reception word obtained by the communication unit 231, a deinterleaver 233 for rearranging the convolutional-decoded reception word to its original order, and a Reed-Solomon SPA decoding unit 234 for decoding the digital data rearranged to the original order through the sum product algorithm and reconstituting the digital data in the previous state where Reed-Solomon encoding is not yet performed.

The communication unit 231 communicates with the communication unit 214 of the encoder 210 via the communication path 221 and obtains the digital data transmitted from the communication unit 214, as a reception word, based on a predetermined protocol. The communication unit 231 transmits the obtained reception word to the convolutional-decoding unit 232.

The convolutional-decoding unit 232 decodes the reception word transmitted from the transmission unit 231 according to a method corresponding to the method of encoding performed by the convolutional-encoding unit 213 of the encoder 210. That is to say, the convolutional-decoding unit 232 performs soft-decision decoding for the reception word by using the BCJR (Bahl, Cocke, Jelinek, and Raviv) algorithm, the SOVA (soft output Viterbi algorithm), and so forth, for achieving Maximum a posteriori probability decoding (MAP decoding, for example). Then, the convolutional-decoding unit 232 transmits the soft-decision-decoded reception word to the deinterleaver 233.

The deinterleaver 233 performs data rearranging for the transmitted reception word according to a method corresponding to the interleaving performed by the interleaver 212 of the encoder 210, performs processing for resetting the rearranged data to the original order (deinterleaving), and transmits the reception word rearranged to the original order to the Reed-Solomon SPA decoding unit 234.

Basically, the Reed-Solomon SPA decoding unit 234 is configured and operates as is the case with the decoder 150 shown in FIG. 20. Further, the block diagram shown in FIG. 20 and the flowchart shown in FIG. 21 can be used for the Reed-Solomon SPA decoding unit 234. Therefore, the description thereof will be omitted.

The Reed-Solomon SPA decoding unit 234 expands the parity check matrix of the reception word subjected to Reed-Solomon encoding and reduces the density of the parity check matrix thereof. Then, the Reed-Solomon SPA decoding unit 234 performs decoding through the sum product algorithm by using the parity check matrix and reconstitutes the digital data in the previous state where encoding is not yet performed. The Reed-Solomon SPA decoding unit 234 transmits the decoded digital data outside the decoder 230.

As described above, the error correction system shown in FIG. 25 can easily perform high-performance decoding and communications more accurately than ever. Further, since the decoder 230 expands each element and column of the parity check matrix before reducing the density of the parity check matrix, the operation cost for decoding can be reduced.

Further, in the above-described embodiment, the error correction system is used for decoding the Reed-Solomon code. However, the error correction system may decode BCH codes, for example, without being limited to the above-described embodiment.

Figure 26:
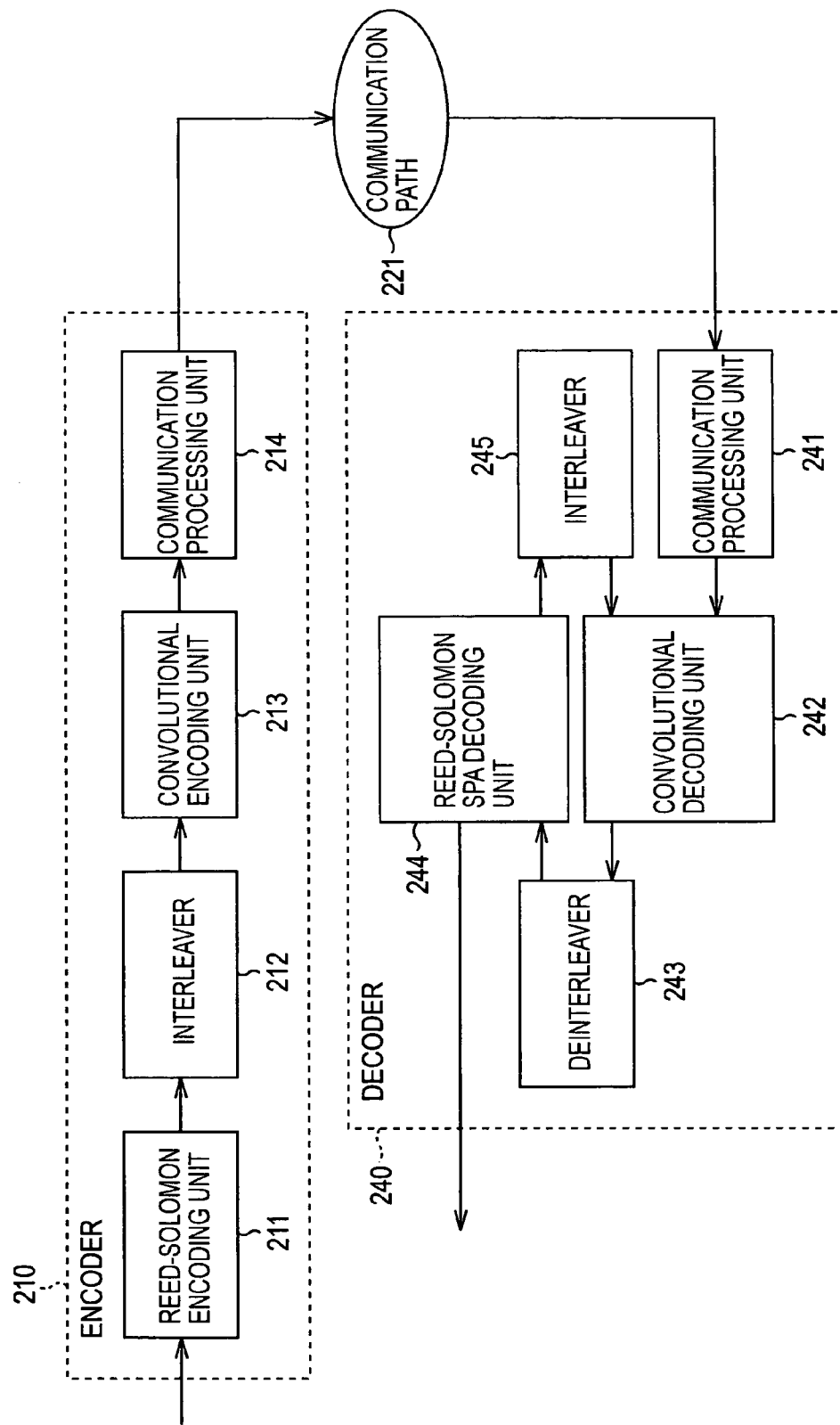
FIG. 26 is a block diagram illustrating the configuration of another example error correction system using the present invention.

FIG. 26 is a block diagram showing the configuration of another example error correction system using a Reed-Solomon code according to the present invention. The error correction system shown in FIG. 26 is a system used for the digital-communication system such as the digital TV, for example. The same parts as those shown in FIG. 25 are designated by the same reference numerals and the description thereof will be omitted.

In the error correction system shown in FIG. 26, digital data encoded by the encoder 210 on the transmission side is transmitted to a decoder 240 on the reception side via the communication path 221 such as the Internet, for example.

The decoder 240 includes a communication unit 241 for receiving the digital data transmitted via the communication path 221, as a reception word, a convolutional-decoding unit 242 for performing convolutional decoding for the reception word obtained by the communication unit 241, a deinterleaver 243 for rearranging the convolutional-decoded reception word to the original order, a Reed-Solomon SPA decoding unit 244 for performing decoding through the sum product algorithm for the digital data reset to the original order, so as to reconstitute the digital data in the previous state where Reed-Solomon encoding is not yet performed, and an interleaver 245 for rearranging the digital data, as is the case with the interleaver 212 of the encoder 210.

As is the case with the communication unit 231 shown in FIG. 25, the communication unit 241 communicates with the communication unit 214 of the encoder 210 via the communication path 221 and obtains the digital data transmitted from the communication unit 214, as a reception word, based on a predetermined protocol. The communication unit 241 transmits the obtained reception word to the convolutional-decoding unit 242.

The convolutional-decoding unit 242 decodes the reception word transmitted from the transmission unit 241 according to a method corresponding to the method of encoding performed by the convolutional-encoding unit 213 of the encoder 210. That is to say, the convolutional-decoding unit 242 performs soft-decision decoding for the reception word by using the BCJR algorithm, the SOVA, and so forth. Then, the convolutional-decoding unit 242 transmits the soft-decision-decoded reception word to the deinterleaver 243. Further, the reception word that had been subjected to decoding through the sum product algorithm is rearranged again and transmitted from the interleaver 256 to the convolutional-decoding unit 242. The convolutional-decoding unit 242 performs soft-decision decoding for the reception word by using the BCJR algorithm, SOVA, and so forth, as is the case with the reception word transmitted from the communication unit 241, and transmits the reception word to the deinterleaver 243.

As is the case with the deinterleaver 233 shown in FIG. 25, the deinterleaver 243 performs data rearranging for the reception word transmitted from the convolutional-decoding unit 242 according to a method corresponding to the interleaving performed by the interleaver 212 of the encoder 210, performs processing for resetting the rearranged data to the original order (deinterleaving), and transmits the reception word rearranged to the original order to the Reed-Solomon SPA decoding unit 244. Further, as described above, the reception word transmitted from the convolutional-decoding unit 242 includes a reception word transmitted from the interleaver 245 via the convolutional-decoding unit 242 other than the reception word transmitted from the communication unit 241 via the convolutional-decoding unit 242.

Basically, the Reed-Solomon SPA decoding unit 244 is configured and operates as is the case with the decoder 150 shown in FIG. 20, as in the case of the Reed-Solomon SPA decoding unit 244 shown in FIG. 25. The block diagram shown in FIG. 20 and the flowchart shown in FIG. 21 can be used for the Reed-Solomon SPA decoding unit 244, as in the case of the decoder 150.

The Reed-Solomon SPA decoding unit 244 expands the parity check matrix in the reception word obtained from the deinterleaver 243 and reduces the density of the parity check matrix. Then, the Reed-Solomon SPA decoding unit 244 performs decoding through the sum product algorithm by using the parity check matrix and reconstitutes the digital data in the previous state where encoding is not yet performed. The Reed-Solomon SPA decoding unit 244 transmits the decoded digital data outside the decoder 240. Further, the Reed-Solomon SPA decoding unit 244 transmits the decoded digital data to the interleaver 245.

The interleaver 245 rearranges the obtained the digital data to a predetermined order, as in the case of the interleaver 212 of the encoder 210. The pattern of rearrangement performed by the interleaver 245 is the same as in the case of the interleaver 212. The digital data rearranged in the above-described manner is transmitted to the convolutional-decoding unit 242.

As has been described, the decoder 240 performs soft-decision decoding by the convolutional-decoding unit 242 and decoding through the sum product algorithm by the Reed-Solomon SPA decoding unit 244 for the reception word obtained by the communication unit 241 repetitively via the deinterleaver 243 and the interleaver 245, so as to decrease the probability of decoding errors that occur during the decoding. The number of repetitions of decoding may be predetermined in advance. Otherwise, it may be determined whether or not the repetitions should be discontinued according to a predetermined condition such as the number of positions where error correction is performed, for example.

As described above, the decoder 240 can easily perform high-performance decoding and the error correction system shown in FIG. 26 can perform communications more accurately than ever. Further, since the decoder 240 expands each element and column of the parity check matrix before reducing the density of the parity check matrix, the operation cost for decoding can be reduced.

As described above, the Reed-Solomon SPA decoding unit 244 outputs the decoded digital data outside the decoder 240 and transmits the decoded digital data to the interleaver 245. However, without being limited to the above-described configuration, the Reed-Solomon SPA decoding unit 244 may transmit the decoded digital data only to the interleaver 245 during decoding is repetitively performed. Where the repetitions of decoding are terminated, the output destination of the digital data may be switched from the interleaver 245 outside the decoder 240, so that the decoded digital data is output.

As described above, the error correction system is configured to decode a Reed-Solomon code. However, without being limited to the above-described configuration, the error correction system may decode a BCH code, for example.

Figure 27:
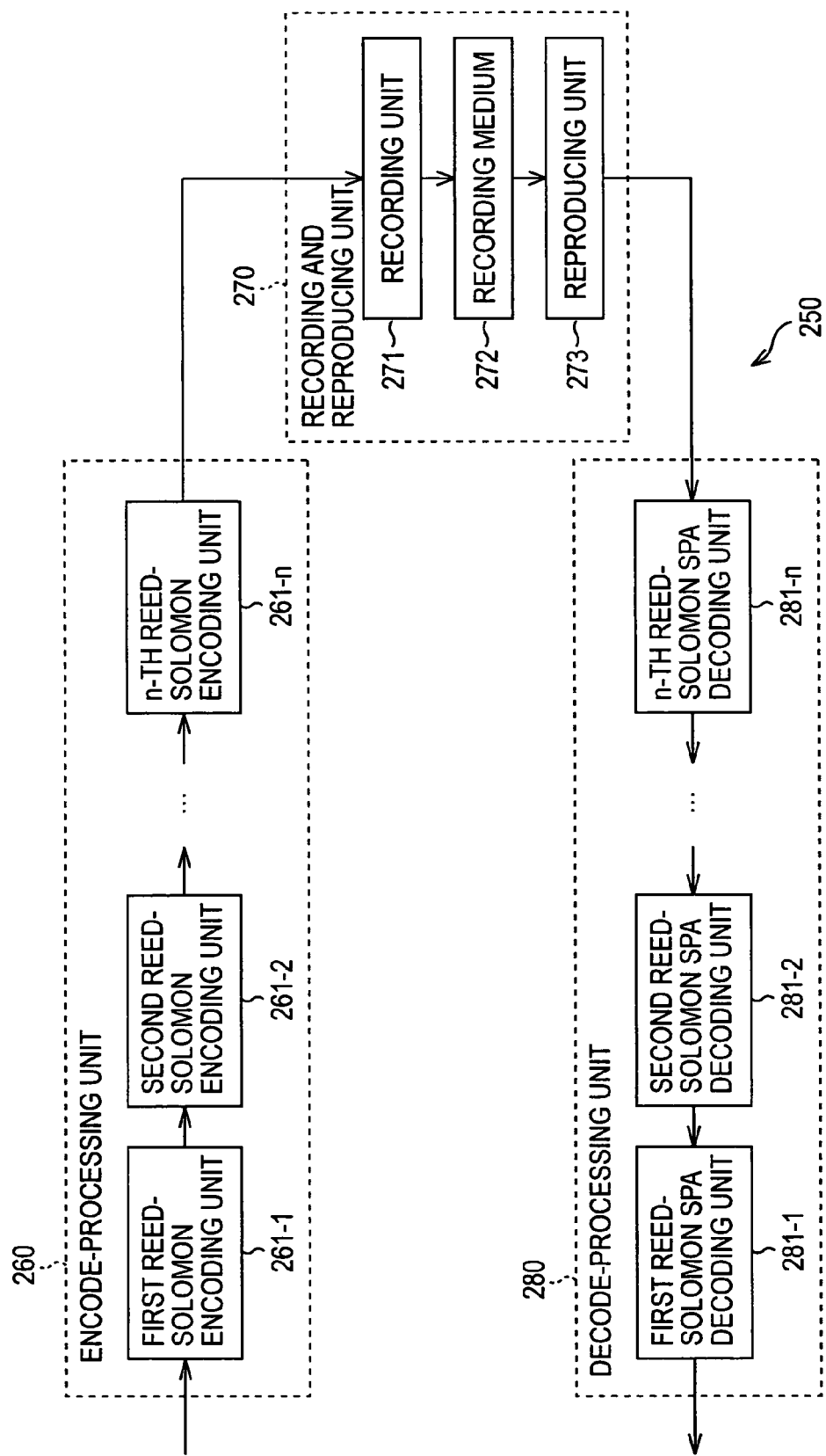
FIG. 27 is a block diagram illustrating the configuration of an example recording-and-reproducing apparatus using the present invention.

FIG. 27 is a block diagram illustrating the configuration of an example recording-and-reproducing apparatus using the error correction system for performing error correction by using the Reed-Solomon code according to the present invention. The recording-and-reproducing apparatus shown in FIG. 27 is a digital-recording-medium recording-and-reproducing apparatus, such as a DVD record player or the like.

The recording-and-reproducing apparatus 250 shown in FIG. 27 encodes the externally transmitted digital data through the encode-processing unit 260 and records the digital data onto a recording medium 272 in a recording-and-reproducing unit 270. Further, the recording-and-reproducing apparatus 250 reproduces the digital data recorded on the recording medium 272 in the recording-and-reproducing unit 270, obtains the original digital data by performing decoding in a decode-processing unit 280, and externally outputs the data.

The encode-processing unit 260 includes first to n-th Reed-Solomon encoding units 261-1 to 261-n for performing Reed-Solomon encoding for the digital data, where the Reed-Solomon encoding relates to degrees that are different from one another.

The digital data transmitted from outside the encode-processing unit 260 is subjected to Reed-Solomon encoding relating to degree one in the first Reed-Solomon encoding unit 261-1. Then, the digital data is sequentially subjected to Reed-Solomon encoding relating to each of degrees two to n in the second to n-th Reed-Solomon encoding units 261-2 to 261-n. Where the n-th Reed-Solomon encoding unit 261-n finishes encoding, the encode-processing unit 260 transmits the encoded digital data to the recording-and-reproducing unit 270.

The recording-and-reproducing unit 270 includes a recording unit 271 for recording the data transmitted from the encode-processing unit 260 onto the recording medium 272, the recording medium 272 such as an optical disk, for example, and a reproducing unit 273 for reproducing the data recorded on the recording medium 272.

The recording unit 271 of the recording-and-reproducing unit 270 performs NRZI (Non Return to Zero Invert) conversion (NRZI encoding) for the digital data transmitted from the encoding unit, for example, and records the digital data onto the recording medium 272. Further, the reproducing unit 273 of the recording-and-reproducing unit 270 reproduces the digital data recorded on the recording medium 272 (the digital data subjected to Reed-Solomon encoding), restores (decodes) the NRZI-converted digital data, and transmits the digital data to a decode-processing unit 280.

The decode-processing unit 280 is a decoder corresponding to the encode-processing unit 260 and includes first to n-th Reed-Solomon SPA decoding units 281-1 to 281-n for performing decoding for the digital data through the sum product algorithm relating to degrees that are different to one another.

The first to n-th Reed-Solomon SPA decoding units 281 to 281-n correspond to the first to n-th Reed-Solomon encoding units 261-1 to 261-n of the encode-processing unit 260, respectively, and perform decoding through the sum product algorithm-for Reed-Solomon codes relating to the degrees. Basically, each of from the first to n-th Reed-Solomon SPA decoding units 281-1 to 281-n is configured and operates as is the case with the decoder 150 shown in FIG. 20. Subsequently, as is the case with the decoder 150, the block diagram shown in FIG. 20 and the flowchart shown in FIG. 21 can be used for the first to n-th Reed-Solomon SPA decoding units 281-1 to 281-n.

The decode-processing unit 280 expands each of the elements and columns of a parity check matrix of the digital data transmitted from the reproducing unit 273 in each of from the first to n-th Reed-Solomon SPA decoding units 281-1 to 281-n, reduces the density of the parity check matrix, and performs decoding relating to each degree through the sum product algorithm. At that time, the decode-processing unit 280 performs decoding that is the reverse of decoding performed by the encode-processing unit 260, as shown in FIG. 27. First, the decode-processing unit 280 performs decoding relating to the n-th degree through the sum product algorithm in the n-th Reed-Solomon SPA decoding unit 281-n, and subsequently performs decoding through the sum product algorithm in decreasing order of degrees, that is, from degree n−1 to degree n−2 in the Reed-Solomon SAP decoding units that are connected in series to one another. Finally, the decode-processing unit 280 performs decoding through the sum product algorithm relating to degree one in the first Reed-Solomon SPA decoding unit 281-1. The decode-processing unit 280 outputs the original digital data reconstituted in the above-described manner outside the recording-and-reproducing apparatus 250.

As described above, the decode-processing unit 280 can easily perform high-performance decoding and the recording-and-reproducing apparatus 250 can record and reproduce digital data more accurately than ever. Further, since the decode-processing unit 280 expands each of the elements and columns of the parity check matrix before reducing the density of the parity check matrix, the operation cost for decoding can be reduced.

As described above, the recording-and-reproducing apparatus 250 is configured to decode a Reed-Solomon code. However, without being limited to the above-described configuration, the recording-and-reproducing apparatus 250 may be configured to decode a BCH code, for example.

The above-described embodiment illustrates the recording-and-reproducing apparatus for recording and reproducing digital data. However, the recording function of recording the digital data onto the recording medium and the reproducing function of reproducing the digital data recorded on the recording medium of the recording-and-reproducing apparatus 250 may be provided in units separated from each other.

Figure 28:
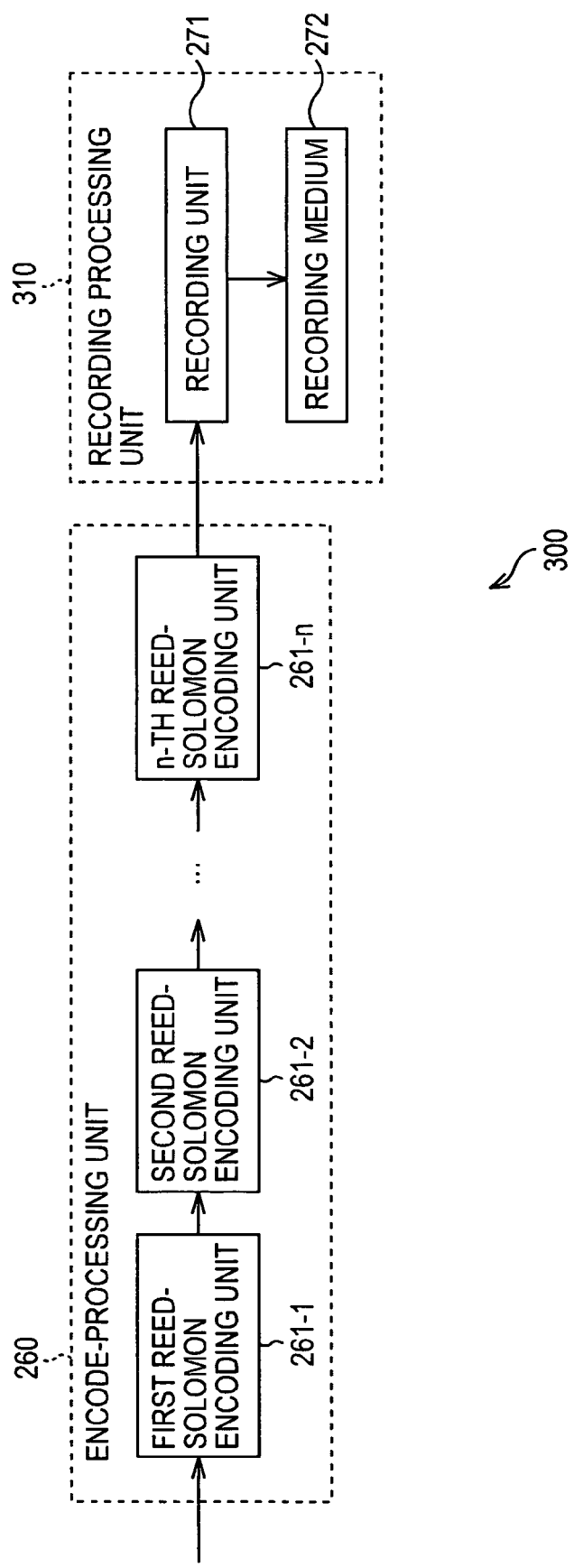
FIG. 28 is a block diagram showing the configuration of an example recording apparatus.

FIG. 28 is a block diagram showing the configuration of an example recording apparatus having the same recording function as that of the recording-and-reproducing apparatus 250 shown in FIG. 27. The same parts as those shown in FIG. 27 are designated by the same reference numerals and the description thereof is omitted.

A recording apparatus 300 shown in FIG. 28 includes the encode-processing unit 260 including the first to n-th Reed-Solomon encoders 261-1 to 261-n and a record processing unit 310 including the recording unit 271 and the recording medium 272. First, digital data transmitted from outside the encode-processing unit 260 of the recording apparatus 300 is subjected to Reed-Solomon encoding relating to degree one in the first Reed-Solomon encoding unit 261-1. Next, the digital data subjected to the encoding relating to degree one is transmitted to the second to n-th Reed-Solomon encoding units 261-2 to 261-n in sequence and subjected to Reed-Solomon encoding relating to degrees two to n in the units. Where the n-th Reed-Solomon encoding unit 261-n finishes encoding, the encode-processing unit 260 transmits the encoded digital data to the record processing unit 310.

The record processing unit 310 includes the recording unit 271 for recording the data transmitted from the encode processing unit 260 onto the recording medium 272 and the recording medium 272 such as an optical disk, for example. The recording unit 271 of the record-processing unit 310 performs NRZI conversion (NRZI encoding) for the digital data transmitted from the encode-processing unit 260, for example, and records the digital data onto the recording medium 272.

That is to say, as is the case with the recording-and-reproducing apparatus 250 shown in FIG. 27, the recording apparatus 300 performs Reed-Solomon encoding for the digital data in the encode-processing unit 260 and records the Reed-Solomon-encoded digital data onto the recording medium 272 under the control of the recording unit 271 of the record processing unit 310.

Figure 29:
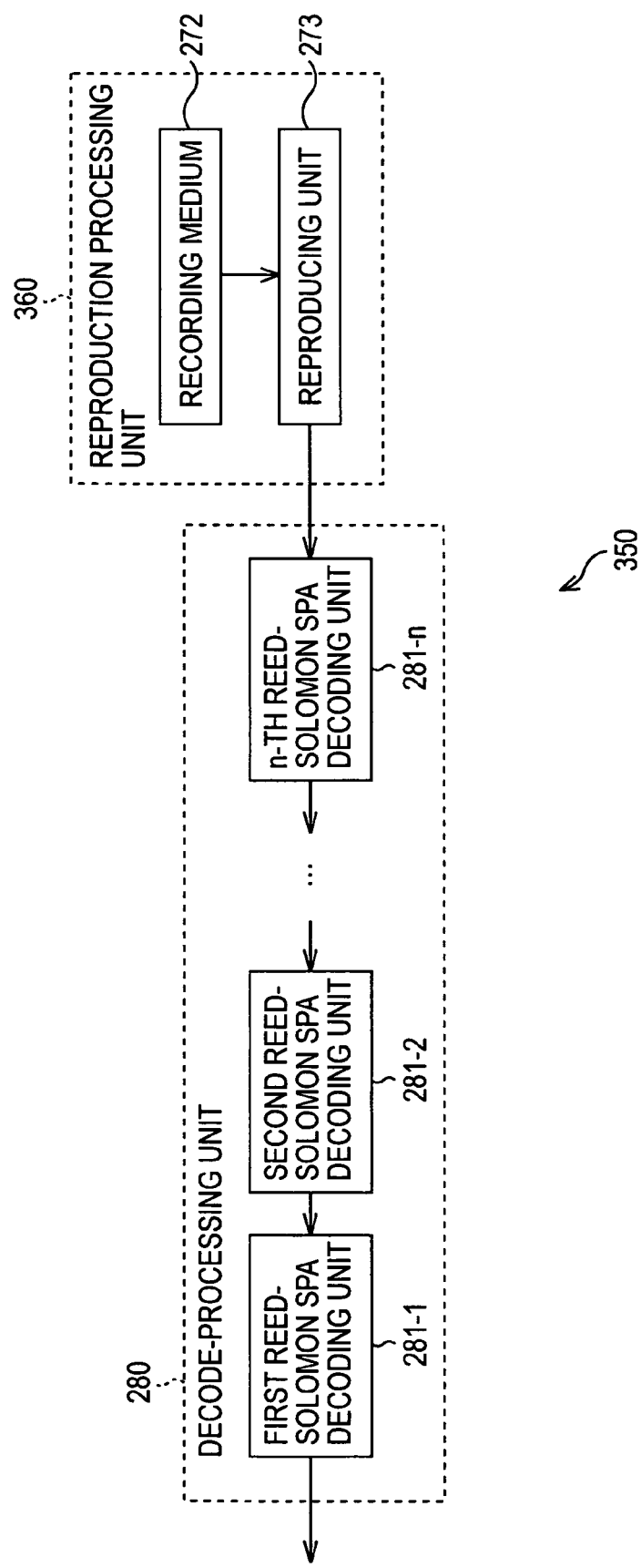
FIG. 29 is a block diagram showing the configuration of an example reproducing apparatus using the present invention.

FIG. 29 shows a recording apparatus corresponding to the above-described recording apparatus 300. The same parts as those shown in FIG. 27 are designated by the same reference numerals and the description thereof is omitted.

A reproducing apparatus 350 shown in FIG. 29 is a reproducing apparatus corresponding to the recording apparatus 300 shown in FIG. 28 and includes the decode-processing unit 280 including the first to n-th Reed-Solomon SPA decoding units 281-1 to 281-n and a decode-processing unit 350 including the recording medium 272 and the reproducing unit 273. The reproducing unit 273 of the reproducing apparatus 350 reproduces the digital data recorded on the recording medium 272 (the digital data subjected to Reed-Solomon encoding), restores (decodes) the NRZI-converted digital data, and transmits the digital data to the decode-processing unit 280.

In the first to n-th Reed-Solomon SPA decoding units 281-1 to 281-n, the decode-processing unit 280 expands each of the elements and columns of a parity check matrix of the digital data transmitted from the reproducing unit 273, reduces the density of the parity check matrix, and performs decoding through the sum product algorithm relating to each degree. At that time, the decode-processing unit 280 performs decoding that is the reverse of decoding performed by the encode-processing unit 260, as shown in FIG. 29. First, the decode-processing unit 280 performs decoding through the sum product algorithm relating to the n-th degree in the n-th Reed-Solomon SPA decoding unit 281-n, and subsequently performs decoding through the sum product algorithm in decreasing order of degrees, that is, from degree n−1 to degree n−2 in the Reed-Solomon SAP decoding units that are connected in series to one another. Finally, the decode-processing unit 280 performs decoding through the sum product algorithm relating to the first degree in the first Reed-Solomon SPA decoding unit 281-1. The decode-processing unit 280 transmits the original digital data reconstituted in the above-described manner outside the reproducing apparatus 350.

As described above, the decode-processing unit 280 can easily perform high-performance decoding and the reproducing apparatus 350 can reproduce digital data more accurately than ever. Further, since the decode-processing unit 280 expands each of the elements and columns of the parity check matrix before reducing the density of the parity check matrix, the operation cost for decoding can be reduced.

As described above, the recording-and-reproducing apparatus 300 is configured to decode a Reed-Solomon code. However, without being limited to the above-described configuration, the recording-and-reproducing apparatus 300 may be configured to decode a BCH code, for example.

Figure 30:
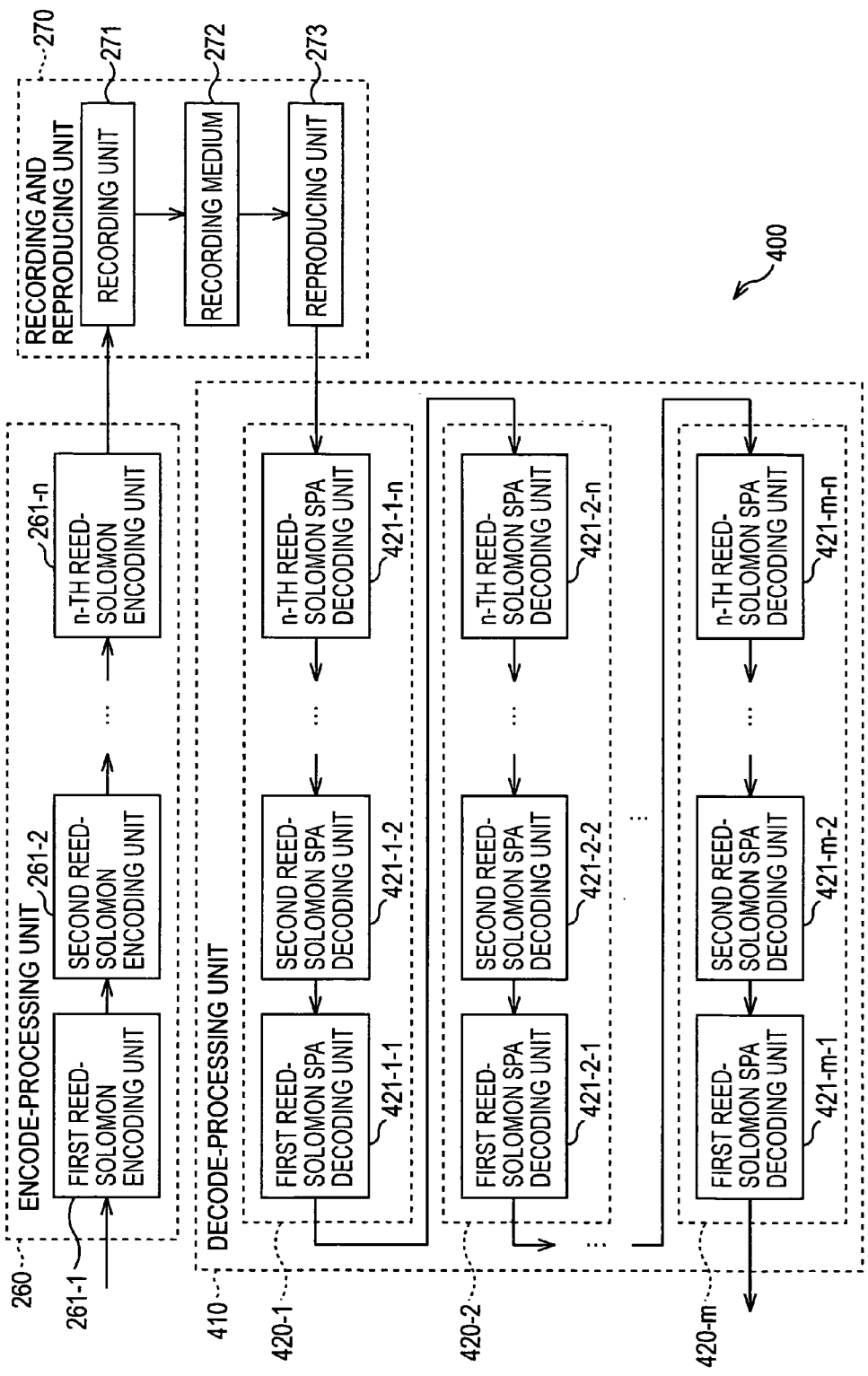
FIG. 30 is a block diagram illustrating the configuration of another example recording-and-reproducing apparatus using the present invention.

FIG. 30 is a block diagram illustrating the configuration of an example recording-and-reproducing apparatus using the error correction system for performing error correction by using Reed-Solomon codes according to the present invention. A recording-and-reproducing apparatus 400 shown in FIG. 30 is a digital-recording-medium recording-and-reproducing apparatus, such as a DVD record player or the like, for example. The same parts as those shown in FIG. 27 are designated by the same reference numerals and the description thereof is omitted.

The recording-and-reproducing apparatus 400 shown in FIG. 30 encodes the externally transmitted digital data through the encode-processing unit 260 and records the digital data onto the recording medium 272 in the recording-and-reproducing unit 270. Further, the recording-and-reproducing apparatus 400 reproduces the digital data recorded onto the recording medium 272 in the recording-and-reproducing unit 270, obtains the original digital data by performing decoding in a decode-processing unit 410, and externally outputs the data.

The decode-processing unit 410 is a decoder corresponding to the encode-processing unit 260 and includes m decoding units connected in series, that is, first to m-th decoding units 420-1 to 420-m. Each of the units is configured and performs decoding as is the case with that of the decode-processing unit 280 shown in FIG. 27.

As is the case with the decode-processing 280 shown in FIG. 27, the first decoding unit 420-1 includes n decoding units connected in series, that is, first to n-th Reed-Solomon SPA decoding units 421-1-1 to 421-1-n that correspond to the first to n-th Reed-Solomon encoding units 261-1 to 261-n of the encode-processing unit 260 and that performs decoding through the sum product algorithm for Reed-Solomon codes relating to the degrees. Basically, each of the first to n-th Reed-Solomon SPA decoding units 421-1-1 to 421-1-n is configured and operates, as is the case with the decoder 150 shown in FIG. 20. Therefore, the block diagram shown in FIG. 20 and the flowchart shown in FIG. 21 can be used for each of the first to n-th Reed-Solomon SPA decoding units 421-1-1 to 421-1-n, as is the case with the decoder 150.

Each of second to m-th decoding units 420-2 to 420-m is configured and operates as is the case with the first decoding unit 420-1. For example, the second decoding unit 420-2 includes n decoding units connected in series, that is, first to n-th Reed-Solomon SPA decoding units 421-2-1 to 421-2-n and the m-th decoding unit 420-m includes n-decoding units connected in series, that is, first to n-th Reed-Solomon SPA decoding units 421-m-1 to 421-m-n. Further, all the first to n-th Reed-Solomon SPA decoding units forming the above-described second to m-th decoding units 420-2 to 420-m have basically the same configurations and operate in the same manner, as is the case with the decoder 150 shown in FIG. 20. Therefore, the block diagram shown in FIG. 20 and the flowchart shown in FIG. 21 can be used for each of the first to n-th Reed-Solomon SPA decoding units, as is the case with the decoder 150.

First, the decode-processing unit 410 expands each of the elements and columns of a parity check matrix of the digital data transmitted from the reproducing unit 273, reduces the density of the parity check matrix, and performs decoding through the sum product algorithm relating to each degree in the first to n-th Reed-Solomon SPA decoding units 421-1-1 to 421-1-n of the first decoding unit 420-1.

At that time, the first decoding unit 420-1 performs decoding that is the reverse of decoding performed by the encode-processing unit 260. First, the first decoding unit 420-1 performs decoding through the sum product algorithm relating to the n-th degree in the n-th Reed-Solomon SPA decoding unit 421-1-n, and subsequently performs decoding through the sum product algorithm in decreasing order of dimensions, that is, from degree n−1 to degree n−2 in the Reed-Solomon SPA decoding units that are connected in series. Finally, the first decoding unit 420-1 performs decoding through the sum product algorithm relating to the first degree in the first Reed-Solomon SPA decoding unit 421-1-1.

Where the decoding is finished, the first decoding unit 420-1 transmits the decoded digital data to the second decoding unit 420-2. The second decoding unit 420-2 performs decoding through the sum product algorithm in decreasing order of degrees on a one-by-one basis by using the first to n-th Reed-Solomon SPA decoding units 421-2-1 to 421-2-n, as is the case with the first decoding unit 420-1; and transmits the decoded digital data to the next decoding unit. Thus, decoding is sequentially performed to the m-th decoding unit 420-m. Where decoding is finished in the m-th decoding unit 420-m, the decode-processing unit 410 outputs the decoded digital data outside the recording-and-reproducing apparatus 400.

According to the above-described configuration, the decode-processing unit 410 can easily perform high-performance decoding and the recording-and-reproducing apparatus 400 can record and reproduce digital data more accurately than ever. Further, since the decode-processing unit 410 expands each of the elements and columns of the parity check matrix before reducing the density of the parity check matrix, the operation cost for decoding can be reduced.

In the above-described configuration, the recording-and-reproducing apparatus 400 is configured to decode a Reed-Solomon code. However, without being limited to the above-described configuration, the recording-and-reproducing apparatus 400 may be configured to decode a BCH code, for example.

The above-described embodiment illustrates the recording-and-reproducing apparatus for recording and reproducing digital data. However, the recording function of recording the digital data onto the recording medium and the reproducing function of reproducing the digital data recorded on the recording medium of the recording-and-reproducing apparatus 400 may be provided in units separated from each other. In that case, a recording device having the same recording function as that of the recording-and-reproducing apparatus 400 shown in FIG. 30 is configured and operates, as is the case with the recording apparatus 300 shown in FIG. 28. Therefore, the block diagram of FIG. 28 can be used therefor and the description thereof is omitted.

Figure 31:
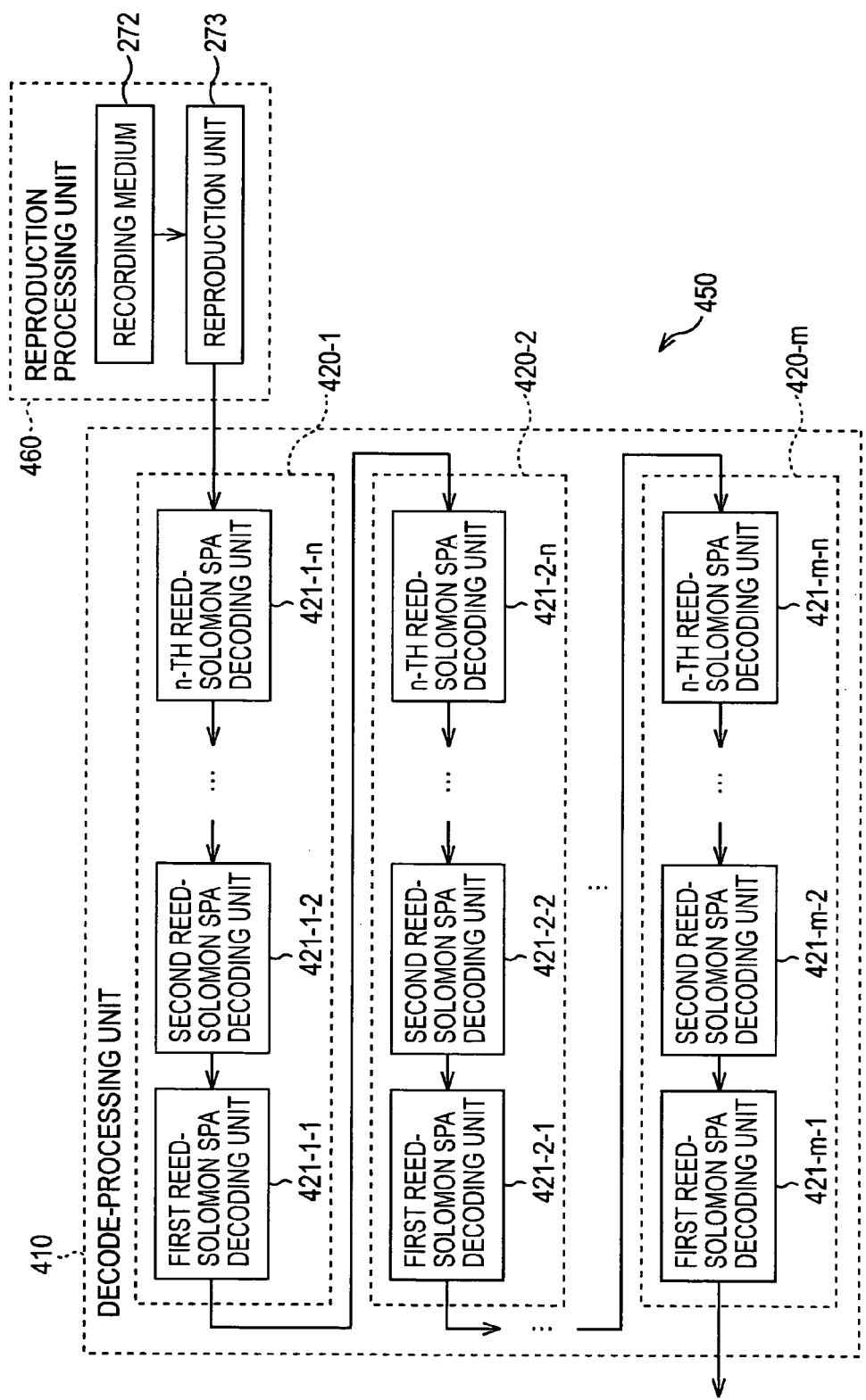
FIG. 31 is a block diagram showing the configuration of another example reproducing apparatus using the present invention.

FIG. 31 shows a reproducing device corresponding to the recording apparatus 300, which is the recording apparatus having the same recording function as that of the recording-and-reproducing apparatus 400 shown in FIG. 30. The same parts as those shown in FIG. 30 are designated by the same reference numerals and the description thereof is omitted.

A reproducing device 450 shown in FIG. 31 is the reproducing device corresponding to the recording apparatus 300 shown in FIG. 28 and has the decode-processing unit 410 including the first to m-th decoding units 420-1 to 420-m and a reproduce-processing unit 460 including the recording medium 272 and the reproducing unit 273. Further, the reproducing unit 273 of the reproducing device 450 reproduces the digital data recorded on the recording medium 272 (the digital data subjected to Reed-Solomon encoding), restores (decodes) the NRZI-converted digital data, and transmits the digital data to the decode-processing unit 410.

First, the decode-processing unit 410 expands each of the elements and columns of the parity check matrix of the digital data transmitted from the reproducing unit 273, reduces the density of the parity check matrix, and performs decoding through the sum product algorithm for each degree in the first decoding unit 420-1. Subsequently, the decode-processing unit 410 transmits the digital data to the second decoding units 420-2 to 420-m connected in series in sequence and performs decoding through the sum product algorithm in the units. Where decoding by the m-th decoding unit 420-m is finished, the decode-processing unit 410 outputs the decoded digital data outside the recording-and-reproducing apparatus 400.

According to the above-described configuration, the decode-processing unit 410 can easily perform high-performance decoding and the reproducing device 450 can reproduce digital data more accurately than ever. Further, since the decode-processing unit 410 expands each of the elements and columns of the parity check matrix before reducing the density of the parity check matrix, the operation cost for decoding can be reduced.

In the above-described configurations, the present invention is used for decoding a BCH code or a Reed-Solomon code. However, the present invention can be used for decoding any code without being limited to the above-described configurations, so long as the code is a widely used linear code.

In the above-described configurations, the reproducing device 450 is configured to decode a Reed-Solomon code. However, without being limited to the above-described configurations, the reproducing apparatus 400 may be configured to decode a BCH code, for example.

Further, according to the above-described configurations, for example, the decoders and the decoding units using the present invention, such as the decoder 100 shown in FIG. 12, the decoder 150 shown in FIG. 20, the Reed-Solomon SPA decoding unit 234 shown in FIG. 25, the Reed-Solomon SPA decoding unit 244 shown in FIG. 26, the first to n-th Reed-Solomon SPA decoding units 281-1 to 281-n shown in FIG. 27, and the first to m-th decoding units 420-1 to 420-m shown in FIG. 30 reduce the density of a parity check matrix and decode a linear code by using the low-density check matrix, as a method for decoding an ordinary linear code. However, without being limited to the above-described method, it may be arranged that the density of the check matrix is reduced in advance in other devices or other processing units, for example. In that case, the decoding device (or the decoding unit) decodes the linear code transmitted from the encoder or the like by using the check matrix with the reduced density. That is to say, the density of a check matrix is reduced in advance outside the decoder 230 shown in FIG. 25, the decoder 240 shown in FIG. 26, the recording-and-reproducing apparatus 250 shown in FIG. 27, the reproducing apparatus 350 shown in FIG. 29, the recording-and-reproducing apparatus 400 shown in FIG. 30, and the reproducing device 450 shown in FIG. 31, for example. Further, each unit may decode a transmitted linear code by using the check matrix with the reduced density.

The above-described series of processing procedures can be performed by either hardware or software. Where the procedures are performed by the software, the above-described image processing apparatus is formed as a personal computer shown in FIG. 32, for example.

Figure 32:
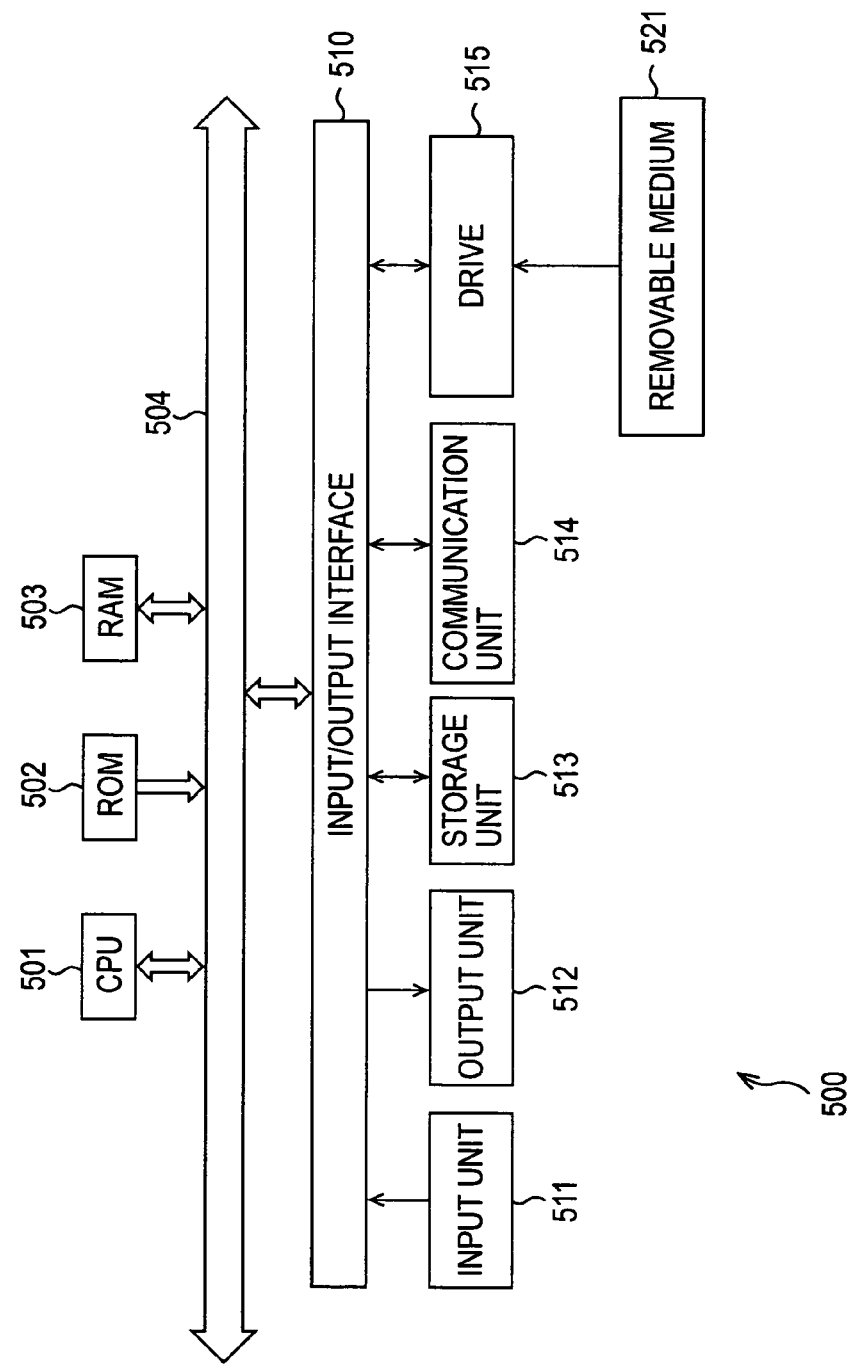
FIG. 32 is a block diagram illustrating the configuration of a computer according to an embodiment of the present invention.

In FIG. 32, a CPU (Central Processing Unit) 501 of a personal computer 500 performs various types of processing according to a program stored in the ROM (Read Only Memory) 502, or a program loaded from a storage unit 513 onto a RAM (Random Access Memory) 503. The RAM 503 further stores data necessary for the CPU 501 to perform the various types of processing, as required.

The CPU 501, the ROM 502, and the RAM 503 are connected to one another via a bus 504. An input-and-output interface 510 is also connected to the bus 504.

An input unit 511 including a keyboard, a mouse, and so forth, a display including a CRT (Cathode Ray Tube), an LCD (Liquid Crystal display), or the like, an output unit 512 including a speaker or the like, a storage unit 513 including a hard disk or the like, and a communication unit 514 including a modem or the like are connected to the input-and-output interface 510. The communication unit 514 performs communications via networks including the Internet.

Further, a drive 515 is connected to the input-and-output interface 510, if necessary, and a removable medium 921 including a magnetic disk, an optical disk, a magneto-optical disk, a semiconductor memory, and so forth, are mounted thereon, as required, and a computer program read therefrom is installed on the storage unit 513, as required.

Where the series of processing procedures are performed through the software, a predetermined program forming the software is installed thereon via a predetermined network or recording medium.

The recording medium is distributed for providing the program to a user, separate from the system, and formed not only by the removable medium 521 storing the program, such as the magnetic disk (including a floppy disk), the optical disk (including a CD-ROM (Compact Disk-Read Only Memory) and a DVD (Digital Versatile Disk)), the magneto-optical disk (including an MD (Mini-Disk)), the semiconductor memory, and so forth, as shown FIG. 32, but also by the ROM 502 storing the program, the hard disk included in the storage unit 513, and so forth, that are mounted in the apparatus in advance and provided to the user.

Further, in this specification, the steps describing the program stored in the recording medium include not only processing procedures performed on the time-series basis in the above-described order, but also processing procedures that are not necessarily performed on the time-series basis but can be performed on the parallel or individual basis.

Further, in this specification, the word system denotes the entire apparatus including the plurality of units.

INDUSTRIAL APPLICABILITY

As has been described, the present invention allows decoding an ordinary linear code. Particularly, where a sum product algorithm is used, as a method for decoding the ordinary linear code, high-performance decoding can be easily performed.

The invention claimed is:

1. A method for decoding a linear code, the method being executed by a decoder and comprising:

reducing density of a check matrix of the linear code by generating a new matrix of reduced density based on elements included in the check matrix whose values are determined to be one "1";

calculating a linear combination of rows of the check matrix;

extracting a subset of lower-weight vectors for forming a complementary space from among a vector set obtained by the linear combination;

including the lower-weight vectors as row elements of the new check matrix; and decoding the linear code through a sum product algorithm by using the new check matrix, the decoding being performed by the decoder.

2. The decoding method according to claim 1, wherein the linear code is a finite field including powers of prime numbers, as elements.

3. The decoding method according to claim 2, wherein the linear code includes a BCH code, or a Reed-Solomon code on the finite field.

4. The decoding method according to claim 1, wherein reducing the density further includes:

expanding the check matrix by expanding a predetermined subfield of the finite field by a predetermined degree; and calculating linear combination of the rows of the expanded check matrix.

5. A decoder for decoding a linear code, the decoder comprising:

means for reducing a density of a check matrix of the linear code by generating a new matrix of reduced density based on elements included in the check matrix whose values are determined to be one "1";

means for calculating a linear combination of rows of the check matrix;

means for extracting a subset of lower-weight vectors for forming a complementary space from among a vector set obtained by the linear combination;

means for including the lower-weight vectors as row elements of the new check matrix; and means for decoding the linear code through a sum product algorithm by using the new check matrix.

6. The decoder according to claim 5, wherein the linear code is a finite field including powers of prime numbers, as elements.

7. The decoder according to claim 6, wherein the linear code includes a BCH code, or a Reed-Solomon code on the finite field.

8. The decoder according to claim 5 further comprising means for expanding the check matrix by expanding a predetermined subfield of the finite field by a predetermined degree, wherein the means for calculating calculates linear combination of rows of the expanded check matrix.

9. The decoder according to claim 5 further including means for performing soft-decision decoding on a linear code subjected to convolutional encoding, wherein the means for reducing reduces the density of a check matrix obtained by decoding the convolutionaly encoded linear code, the reduction being performed by reducing a density of elements included in the obtained check matrix and having values that are determined to be one "1".

10. The decoder according to claim 9, wherein the soft-decision decoding, the low-density processing, and the decoding are repetitively performed.

11. A method for decoding a linear code, the decoding method being executed by a decoder and comprising:

inputting a reception value;

reducing density of a check matrix of the linear code by generating a new matrix of reduced density based on elements included in the check matrix whose values are determined to be one "1";

calculating a linear combination of rows of the check matrix;

extracting a subset of lower-weight vectors for forming a complementary space from among a vector set obtained by the linear combination;

including the lower-weight vectors as row elements of the new check matrix; and decoding the linear code through a sum product algorithm by using the new check matrix and the reception value, the decoding being performed by the decoder.

12. A decoder for decoding a linear code, the decoder comprising:

means for inputting a reception value;

means for reducing density of a check matrix of the linear code by generating a new matrix of reduced density based on elements included in the check matrix whose values are determined to be one "1";

means for calculating a linear combination of rows of the check matrix;

means for extracting a subset of lower-weight vectors for forming a complementary space from among a vector set obtained by the linear combination;

means for including the lower-weight vectors as row elements of the new check matrix; and means for decoding the linear code through a sum product algorithm, by using the new check matrix and the reception value.

13. A computer-readable storage medium storing a program for causing a computer to execute a method of decoding a linear code, the method comprising:

inputting a reception value;

reducing density of a check matrix of the linear code by generating a new matrix of reduced density based on elements included in the check matrix whose values are determined to be one "1";

calculating a linear combination of rows of the check matrix;

extracting a subset of lower-weight vectors for forming a complementary space from among a vector set obtained by the linear combination;

including the lower-weight vectors as row elements of the new check matrix; and decoding the linear code through a sum product algorithm by using the new check matrix and the reception value, the decoding being performed by the decoder.

* * * * *